US011804183B2

(12) United States Patent
Zhang et al.

(10) Patent No.: US 11,804,183 B2
(45) Date of Patent: Oct. 31, 2023

(54) DISPLAY PANEL, DRIVING METHOD, AND DISPLAY DEVICE WITH REAL TIME SWITCH OF FORWARD AND REVERSE SCANNING

(71) Applicants: Wuhan Tianma Micro-Electronics Co., Ltd., Wuhan (CN); Wuhan Tianma MicroElectronics Co., Ltd. Shanghai Branch, Shanghai (CN)

(72) Inventors: Mengmeng Zhang, Shanghai (CN); Yue Li, Shanghai (CN); Yuantao Wu, Shanghai (CN); Jing Huang, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 17/587,766

(22) Filed: Jan. 28, 2022

(65) Prior Publication Data
US 2023/0140104 A1    May 4, 2023

(30) Foreign Application Priority Data
Nov. 1, 2021  (CN) .......................... 202111285351.8

(51) Int. Cl.
*G09G 3/3266*    (2016.01)
*G11C 19/28*    (2006.01)
(Continued)

(52) U.S. Cl.
CPC ........... *G09G 3/3266* (2013.01); *G11C 19/28* (2013.01); *G09G 3/20* (2013.01); *G09G 3/3677* (2013.01);
(Continued)

(58) Field of Classification Search
CPC ......... G09G 3/3266; G09G 2310/0286; G09G 3/20; G09G 3/3677; G09G 2310/0267;
(Continued)

(56) References Cited

U.S. PATENT DOCUMENTS

| 2005/0212446 A1* | 9/2005 | Eom ..................... G09G 3/3233 |
| | | 315/169.3 |
| 2008/0012842 A1* | 1/2008 | Mori .................... G09G 3/3677 |
| | | 345/206 |

(Continued)

FOREIGN PATENT DOCUMENTS

| CN | 1674074 A | 9/2005 |
| CN | 107591135 B | 1/2018 |

*Primary Examiner* — Adam J Snyder
(74) *Attorney, Agent, or Firm* — Anova Law Group, PLLC

(57) ABSTRACT

A display panel, a driving method of a display panel, and a display device are provided. The display panel includes pixel circuits and a gate driving circuit including cascaded first shift register units. A trigger signal input terminal of the first stage first shift register unit is connected to a trigger signal terminal through a first switch element. A signal output terminal of the i-th stage first shift register unit is connected to a trigger signal input terminal of the (i+1)-th stage first shift register unit through a second switch element. A trigger signal input terminal of the N-th stage first shift register unit is connected to the trigger signal terminal through a third switch element. A signal output terminal of the j-th stage first shift register unit is connected to a trigger signal input terminal of the (j−1)-th stage first shift register unit through a fourth switch element.

15 Claims, 19 Drawing Sheets

(51) Int. Cl.
 *G09G 3/36* (2006.01)
 *G09G 3/20* (2006.01)
(52) U.S. Cl.
 CPC ........... *G09G 2310/0267* (2013.01); *G09G 2310/0283* (2013.01); *G09G 2310/0286* (2013.01); *G11C 19/287* (2013.01)
(58) Field of Classification Search
 CPC ............ G09G 2310/0283; G11C 19/28; G11C 19/287
 See application file for complete search history.

(56) References Cited

U.S. PATENT DOCUMENTS

| | | | | |
|---|---|---|---|---|
| 2008/0170009 | A1* | 7/2008 | Eom | G09G 3/3275 345/76 |
| 2009/0122951 | A1* | 5/2009 | Tobita | G11C 19/28 377/68 |
| 2009/0262058 | A1* | 10/2009 | Pak | G09G 3/3677 345/92 |
| 2012/0050234 | A1* | 3/2012 | Jang | G09G 3/3225 345/204 |
| 2014/0198136 | A1* | 7/2014 | Lee | G09G 3/3266 345/82 |
| 2017/0330512 | A1* | 11/2017 | Zhou | G09G 3/3233 |
| 2019/0287465 | A1* | 9/2019 | Zhao | G09G 3/3275 |
| 2020/0027404 | A1* | 1/2020 | Li | G09G 3/3266 |
| 2020/0082765 | A1* | 3/2020 | Zhang | G09G 3/3266 |
| 2020/0394950 | A1* | 12/2020 | Oh | G09G 3/3266 |

\* cited by examiner

DISPLAY PANEL, DRIVING METHOD, AND DISPLAY DEVICE WITH REAL TIME SWITCH OF FORWARD AND REVERSE SCANNING

CROSS-REFERENCE TO RELATED APPLICATION

This application claims the priority of Chinese Patent Application No. 202111285351.8, filed on Nov. 1, 2021, the content of which is incorporated herein by reference in its entirety.

TECHNICAL FIELD

The present disclosure generally relates to the field of display technology and, more particularly, relates to a display panel, a driving method, and a display device.

BACKGROUND

With the development of display technology, users have more and more personalized requirements for functions of a display panel. For example, a display panel needs to have functions of forward and reverse scanning, which requires a gate driving circuit be able to perform top-down scanning or bottom-up scanning.

The gate drive circuit needs to cooperate with corresponding driving sequences to realize the forward and reverse scanning functions. In existing technologies, the forward and reverse scanning functions of the gate drive circuit is realized by changing the driving sequences. For example, when switching from forward scanning to reverse scanning, it is necessary to switch to the driving sequence corresponding to reverse scanning; and when switching from reverse scanning to forward scanning, it is necessary to switch to the driving sequence corresponding to forward scanning. Because of the need to change the driving timing, a driver chip needs to download codes corresponding to the driving sequence, which makes it impossible to realize real-time switching of the forward and reverse scanning functions.

SUMMARY

One aspect of the present disclosure provides a display panel with a display region and a non-display region. The display panel includes M rows of pixel circuits in the display region and a gate driving circuit in the non-display region. The gate driving circuit includes a first gate driving circuit including N stages of cascaded first shift register units. A trigger signal input terminal of the first stage first shift register unit is electrically connected to a trigger signal terminal through a first switch element; and a signal output terminal of the i-th stage first shift register unit is electrically connected to a trigger signal input terminal of the (i+1)-th stage first shift register unit through a second switch element. Control terminals of the first switch element and the second switch element are electrically connected to a forward scanning control signal terminal. A trigger signal input terminal of the N-th stage first shift register unit is electrically connected to the trigger signal terminal through a third switch element. A signal output terminal of the j-th stage first shift register unit is electrically connected to a trigger signal input terminal of the (j−1)-th stage first shift register unit through a fourth switch element. Control terminals of the third switch element and the fourth switch element are electrically connected to a reverse scan control signal terminal. M, N, i, j are all positive integers, N is greater than M, $1 \leq i \leq N-1$, and $2 \leq j \leq N$.

Another aspect of the present disclosure provides a driving method of a display panel. The display panel includes M rows of pixel circuits in the display region and a gate driving circuit in the non-display region. The gate driving circuit includes a first gate driving circuit including N stages of cascaded first shift register units. A trigger signal input terminal of the first stage first shift register unit is electrically connected to a trigger signal terminal through a first switch element; and a signal output terminal of the i-th stage first shift register unit is electrically connected to a trigger signal input terminal of the (i+1)-th stage first shift register unit through a second switch element. Control terminals of the first switch element and the second switch element are electrically connected to a forward scanning control signal terminal. A trigger signal input terminal of the N-th stage first shift register unit is electrically connected to the trigger signal terminal through a third switch element. A signal output terminal of the j-th stage first shift register unit is electrically connected to a trigger signal input terminal of the (j−1)-th stage first shift register unit through a fourth switch element. Control terminals of the third switch element and the fourth switch element are electrically connected to a reverse scan control signal terminal. M, N, i, j are all positive integers, N is greater than M, $1 \leq i \leq N-1$, and $2 \leq j \leq N$. The driving method includes: in a first scanning direction, controlling a forward scanning control signal terminal to output a turn-on electrical level, and controlling a reverse scanning control signal terminal to output a cut-off electrical level; and in a second scanning direction, controlling the forward scanning control signal terminal to output an cut-off electrical level, and controlling the reverse scanning control signal terminal to output a turn-on electrical level.

Another aspect of the present disclosure provides a display device. The display device includes a display panel with a display region and a non-display region. The display panel includes M rows of pixel circuits in the display region and a gate driving circuit in the non-display region. The gate driving circuit includes a first gate driving circuit including N stages of cascaded first shift register units. A trigger signal input terminal of the first stage first shift register unit is electrically connected to a trigger signal terminal through a first switch element; and a signal output terminal of the i-th stage first shift register unit is electrically connected to a trigger signal input terminal of the (i+1)-th stage first shift register unit through a second switch element. Control terminals of the first switch element and the second switch element are electrically connected to a forward scanning control signal terminal. A trigger signal input terminal of the N-th stage first shift register unit is electrically connected to the trigger signal terminal through a third switch element. A signal output terminal of the j-th stage first shift register unit is electrically connected to a trigger signal input terminal of the (j−1)-th stage first shift register unit through a fourth switch element. Control terminals of the third switch element and the fourth switch element are electrically connected to a reverse scan control signal terminal. M, N, i, j are all positive integers, N is greater than M, $1 \leq i \leq N-1$, and $2 \leq j \leq N$.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
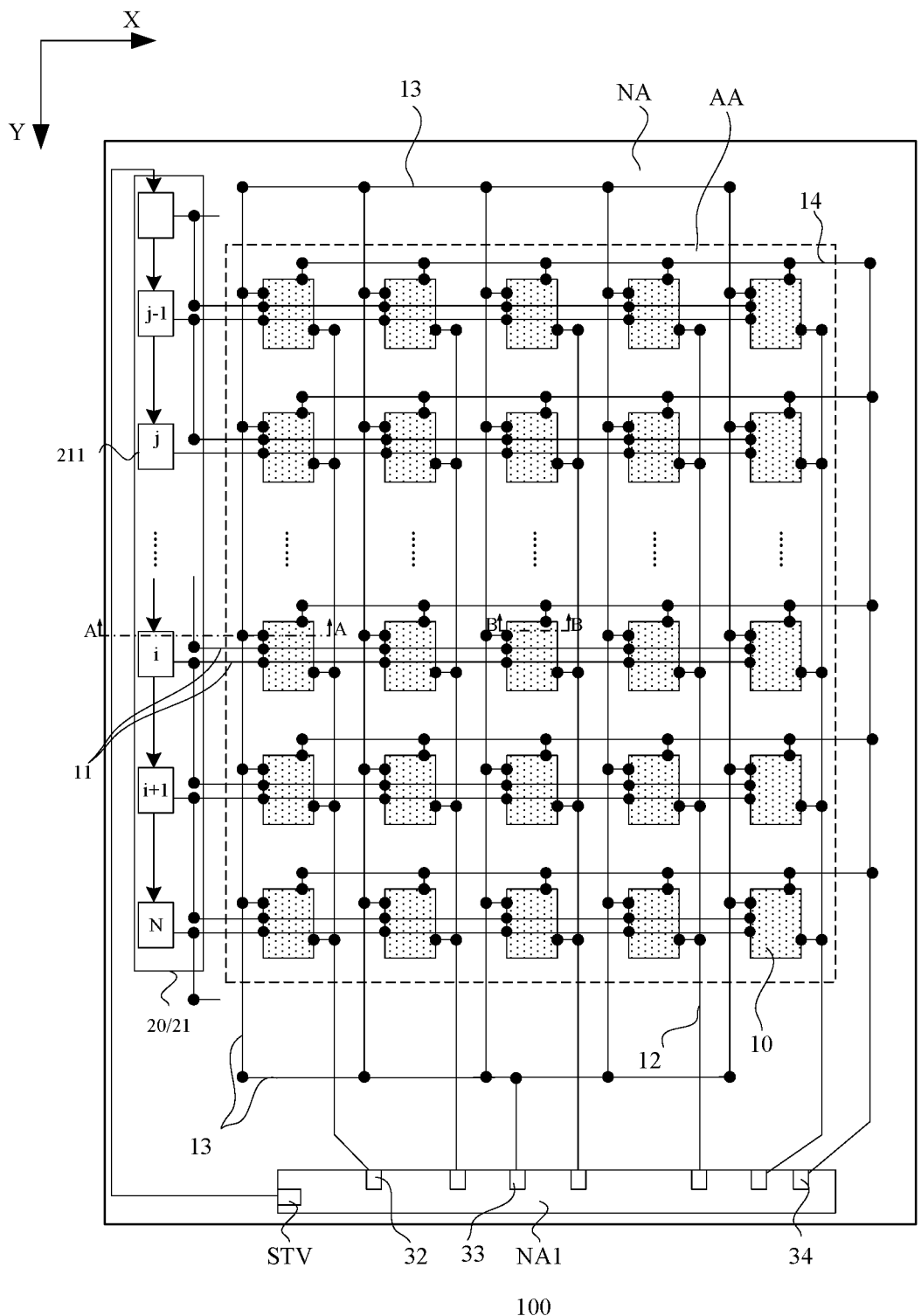
FIG. 1 illustrates an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

In the present disclosure, relational terms such as first and second are only used to distinguish one entity or operation from another entity or operation, and do not necessarily require or imply any such actual relationship between these entities or operations or order. Moreover, the terms "including", "comprising" or any other variants thereof are intended to cover non-exclusive inclusion, such that a process, method, article, or device that includes a series of elements includes not only those elements, but also those that are not explicitly listed or also include elements inherent to this process, method, article or equipment. If there are no more restrictions, the elements defined by the sentence "including . . . " do not exclude the existence of other same elements in the process, method, article, or equipment that includes the elements.

It should be understood that when describing the structure of a component, when a layer or area is referred to as being "on" or "above" another layer or another area, the layer or area may be directly on the other layer or area, or indirectly on the other layer or area, for example, layers/components between the layer or area and another layer or another area. And, for example, when the component is reversed, the layer or area may be "below" or "under" the other layer or area.

In the present disclosure, the term "electrical connection" refers to that two components are directly electrically connected with each other, or the two components are electrically connected via one or more other components.

In some embodiments, a wearable display device may not provide differences between the front and the back wearing, and the wearable display device is configured to support the normal display for both the front and the back wearing. Correspondingly, the wearable display device needs to be compatible with both the forward scanning and the reverse scanning design in the scanning direction.

Driving sequences corresponding to two scanning respectively are designed. when switching from forward scanning to reverse scanning, it is necessary to switch to the driving sequence corresponding to reverse scanning; and when switching from reverse scanning to forward scanning, it is necessary to switch to the driving sequence corresponding to forward scanning. Because of the need to change the driving timing, a driver chip needs to download codes corresponding to the driving sequence, which makes it impossible to realize real-time switching of the forward and reverse scanning functions.

The present disclosure provides a display panel, a driving method of the display panel, and a display device, to achieve switching between the forward and reverse scanning functions without a need to switch the driving sequence and alleviate the problems that it impossible to realize real-time switching of the forward and reverse scanning functions.

The present disclosure provides a display panel. In one embodiment shown in FIG. 1, the display panel 100 may have a display area AA and a non-display area NA. The non-display area NA may at least partially surround the display area AA. For example, the non-display area NA may completely surround the display area AA. In FIG. 1, dashed lines are only used to indicate the boundary of the display area AA, to clearly distinguish the display area AA and the non-display area NA.

The display area AA may be provided with pixel circuits 10 arranged in M rows, and the non-display area NA may be provided with a gate driving circuit 20. The gate driving circuit 20 may be electrically connected to the pixel circuits 10 for providing scanning signals to the pixel circuits 10. M may be a positive integer. The value of M may be configured according to actual needs, which is not limited in the present disclosure.

In one embodiment, the pixel circuits 10 may be distributed in an array in the display area AA. For example, the pixel circuits 10 may be arranged in an array in a first direction X and a second direction Y. The first direction X may intersect the second direction Y.

Figure 2:
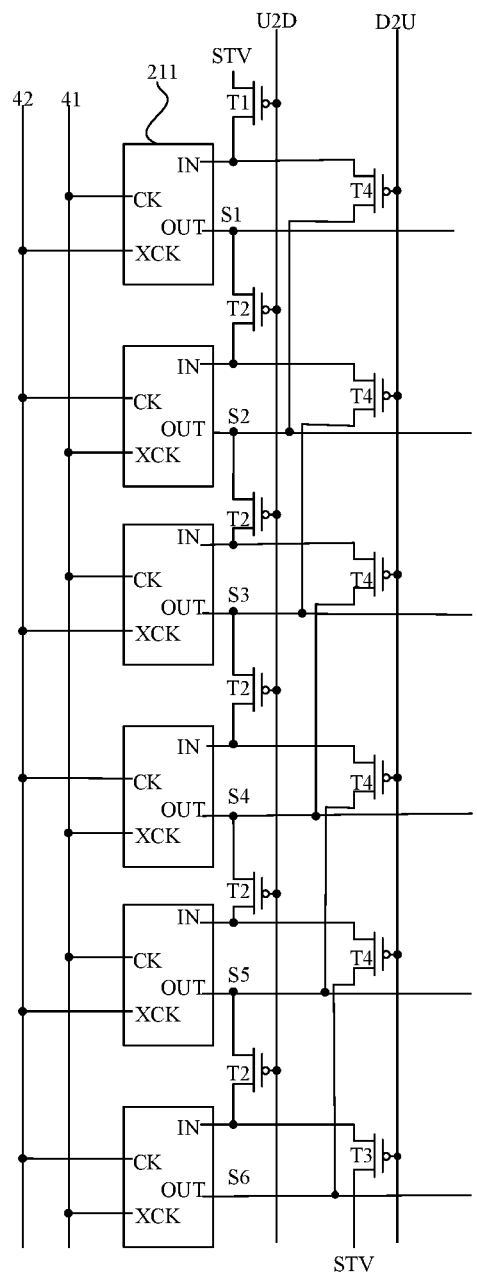
FIG. 2 illustrates a gate driving circuit of an exemplary display panel consistent with various disclosed embodiments in the present disclosure.

As shown in FIG. 1 and FIG. 2, the gate driving circuit 20 may include a first gate driving circuit 21, and the first gate driving circuit 21 may include N stages of first shift register units 211 in a cascaded connection. N may be a positive integer, and may be larger than M.

As shown in FIG. 2, the first shift register unit 211 of each stage may include a trigger signal input terminal IN and a signal output terminal OUT. The trigger signal input terminal IN of the the first stage first shift register unit 211 may be electrically connected to the trigger signal terminal 31 through a first switch element T1, and the signal output terminal OUT of the i-th stage first shift register unit 211 may be electrically connected to the trigger signal input terminal IN of the (i+1)-th stage first shift register unit 211 through a second switch element T2. Control terminals of the first switch element T1 and the second switch element T2 may both be electrically connected to a forward scanning control signal terminal U2D. The trigger signal input terminal IN of the N-th stage first shift register unit 211 may be electrically connected to the trigger signal terminal STV through a third switch element T3, and the signal output terminal OUT of the j-th stage first shift register unit 211 may be electrically connected to the trigger signal input terminal IN of the (j−1)-th stage first shift register unit 211 through a fourth switch element T4. Control terminals of the third switch element T3 and the fourth switch element T4 may both be electrically connected to the reverse scan control signal terminal D2U. Both i and j may be positive integers, and 1≤i≤N−1, 2≤j≤N. The embodiment shown in FIG. 2 where M is equal to 5 and N is equal to 6 is used only as an example to illustrate the present disclosure, and does not limit the scope of the present disclosure. In various embodiments, the specific values of M and N may be configured according to actual needs.

It should be noted that the ordering of the first shift register unit of each stage in the present embodiment is based on the forward scanning direction as an example. In the forward scanning direction, the i-th stage first shift register unit may be a previous stage of the (i+1)-th stage first shift register unit. In the reverse scan direction, the N-th stage first shift register unit may become the first-stage first shift register unit, and the first-stage first shift register unit becomes the last stage first shift register unit, and the j-th stage first shift register unit becomes a previous stage of the (j−1)-th stage first shift register unit.

It can be understood that in the forward scanning direction, signals provided by the trigger signal terminal 31 may be directly used as trigger signals of the first stage first shift register unit 211, and output signals of the first shift register unit 211 of each of other stages may be used as trigger signals of the first shift register unit 211 of the next stage, to realize the stage transmission of the scanning signals in the forward scanning direction.

Figure 3:
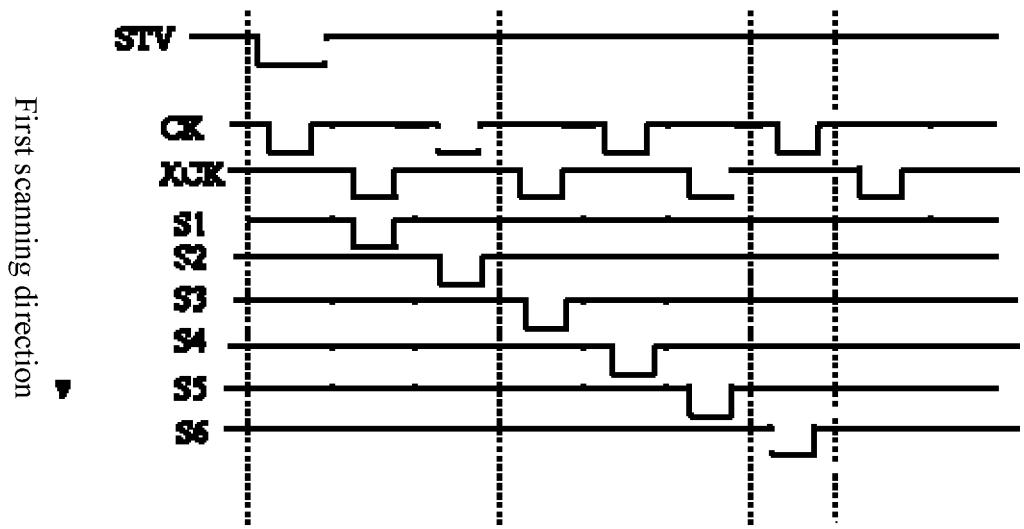
FIG. 3 illustrates a timing diagram corresponding to the gate driving circuit in FIG. 2 consistent with various disclosed embodiments in the present disclosure.

The forward scanning control signal terminal U2D may be controlled to output the turn-on electrical level, and the reverse scanning control signal terminal D2U may be controlled to output the cut-off electrical level, such that the first switch element T1 and the second switch element T2 are turned on, and the third switch element T3 and the fourth switch element T4 are turned off. Correspondingly, the scanning direction of the gate driving circuit 20 may be a first scanning direction, and the first scanning direction may be understood as the forward scanning direction. As shown in FIG. 3, the signal provided by the trigger signal terminal 31 may serve as the trigger signal of the first stage first shift register unit S1, and the output signal of the first stage first shift register unit S1 may serve as the trigger signal the second stage first shift register unit S2, the output signal of the second stage first shift register unit S2 may serve as the trigger signal of the third stage first shift register unit S3, and so on. The first stage first shift register unit S1 to the sixth stage first shift register unit S6 may sequentially output scanning signals, to realize the stage transmission of the scanning signals in the forward scanning direction.

The present embodiment using the low electrical level as the turn-on electrical level and the high electrical level as the cut-off electrical level is used as an example to illustrate the present disclosure only, and does not limit the scope of the present disclosure. Of course, in some other embodiments, it is also possible to set the high electrical level as the turn-on electrical level and the low electrical level as the cut-off electrical level.

In the reverse scanning direction, the signal provided by the trigger signal terminal 31 may serve as the trigger signal of the N-th stage first shift register unit 211, and the output signal of the j-th stage first shift register unit 211 may serve as the trigger signal the (j−1)-th stage first shift register unit 211, to realize the stage transmission of the scanning signals in the reverse scanning direction.

Figure 4:
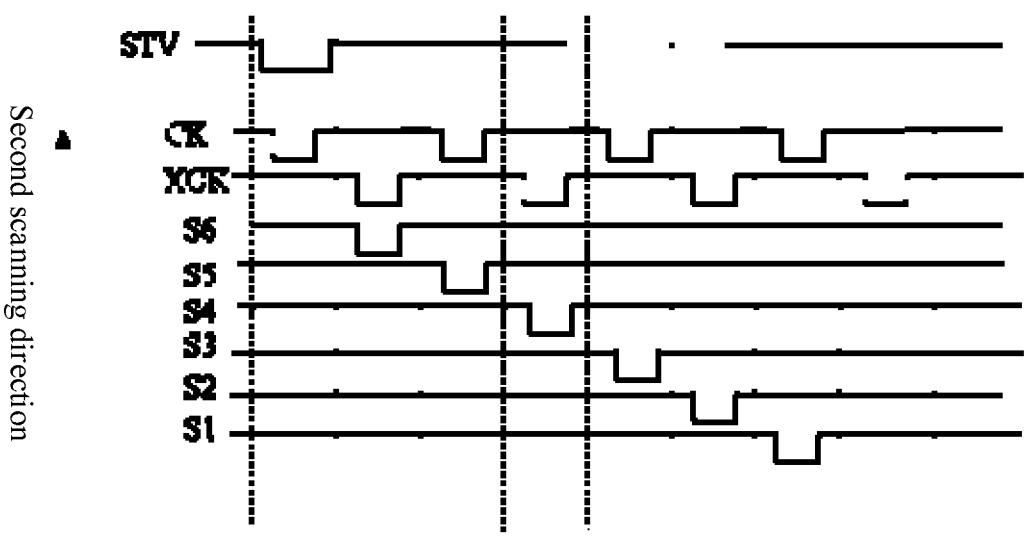
FIG. 4 illustrates another timing diagram corresponding to the gate driving circuit in FIG. 2 consistent with various disclosed embodiments in the present disclosure.

The forward scanning control signal terminal U2D may be controlled to output the cut-off electrical level, and the reverse scanning control signal terminal D2U may be controlled to output the turn-on electrical level, such that the first switch element T1 and the second switch element T2 are turned off, and the third switch element T3 and the forth switch element T4 are turned on. Correspondingly, the scanning direction of the gate driving circuit 20 may be a second scanning direction, and the second scanning direction may be understood as the reverse scanning direction. As shown in FIG. 4, the signal provided by the trigger signal terminal STV may serve as the trigger signal of the sixth stage first shift register unit S6, and the output signal of the sixth stage first shift register unit S6 may serve as the trigger signal the fifth stage first shift register unit S5, the output signal of the fifth stage first shift register unit S5 may serve as the trigger signal of the fourth stage first shift register unit S4, and so on. The sixth stage first shift register unit S6 to the first stage first shift register unit S1 may sequentially output scanning signals, to realize the stage transmission of the scanning signals in the reverse scanning direction.

In the present disclosure, by providing the first switch element to the fourth switch element, it may be only necessary to control the turn-on and cut-off conditions of the first switch element to the fourth switch element in different scanning directions, without changing the signals provided by the trigger signal terminal STV, to achieve switching between the forward scanning direction and the reverse scanning direction. In the forward scanning direction, the first stage first shift register unit to the N-th stage first shift register unit may output scanning signals sequentially. And in the reverse scanning direction, the N-th stage first shift register unit to the first stage first shift register unit may sequentially output the scanning signal. There may be no needs to re-download the codes corresponding to the trigger signal end, thereby solving the technical problem that the display panel cannot realize the instant switching between the forward and reverse scanning functions.

In one embodiment, the non-display area NA of the display panel 100 may be provided a bonding area NA1. The bonding area NA1 may include a plurality of signal terminals. A flexible printed circuit (FPC) may be bonded with the plurality of signal terminals of the bonding area NA1, and then may be bent to a back of the display panel. The driving chips may be integrated to the back of FPC, to make the non-display area of the display panel narrower. The trigger signal terminal 31 may be disposed in the bonding area NA1. The forward scanning control signal terminal U2D and the reverse scanning control signal terminal D2U may also be arranged in the bonding area NA1 (not shown in FIG. 1).

As shown in FIG. 1, in one embodiment, the display panel 100 may further include scan signal lines 11, data signal lines 12, power signal lines 13, and reset signal lines 14. The scan signal lines 11 may be electrically connected to the gate driving circuit 20, and the scan signal lines 11 may be used to transmit the scan signal provided by the gate driving circuit 20 to the pixel circuits 10. The data signal lines 12 may be electrically connected to the data signal terminal 32, and the data signal lines 12 may be used to transmit the data signal provided by the data signal terminal 32 to the pixel circuits 10. The power signal lines 13 may be electrically connected to the power signal terminal 33 for transmitting the voltage signal provided by the power signal terminal 33 to the pixel circuits 10. The reset signal lines 14 may be electrically connected to the reset signal terminal 34, and the reset signal lines 14 may be used to transmit the reset signal provided by the reset signal terminal 34 to the pixel circuits 10.

Exemplarily, the data signal terminal 32, the power signal terminal 33, and the reset signal terminal 34 may also be arranged in the bonding area NA1.

The power signal terminal 33 may provide a signal with positive voltage. For example, the voltage provided by the power signal terminal 33 may range from 3.3V to 4.6V. For example, the voltage provided by the power signal terminal 33 may be 3.3V, 4V, 4.6V, and so on. The reset signal terminal 34 may provide a negative voltage signal. For example, the voltage provided by the reset signal terminal 34 may range from −4.5V to −3V. For example, the voltage provided by the reset signal terminal 34 may be −3V, −4V, −4.5V, and so on.

The display panel may further include a light emission control circuit (not shown in the figures), and the light emission control circuit may be used to provide a light emission control signal to the pixel circuits.

Figure 5:
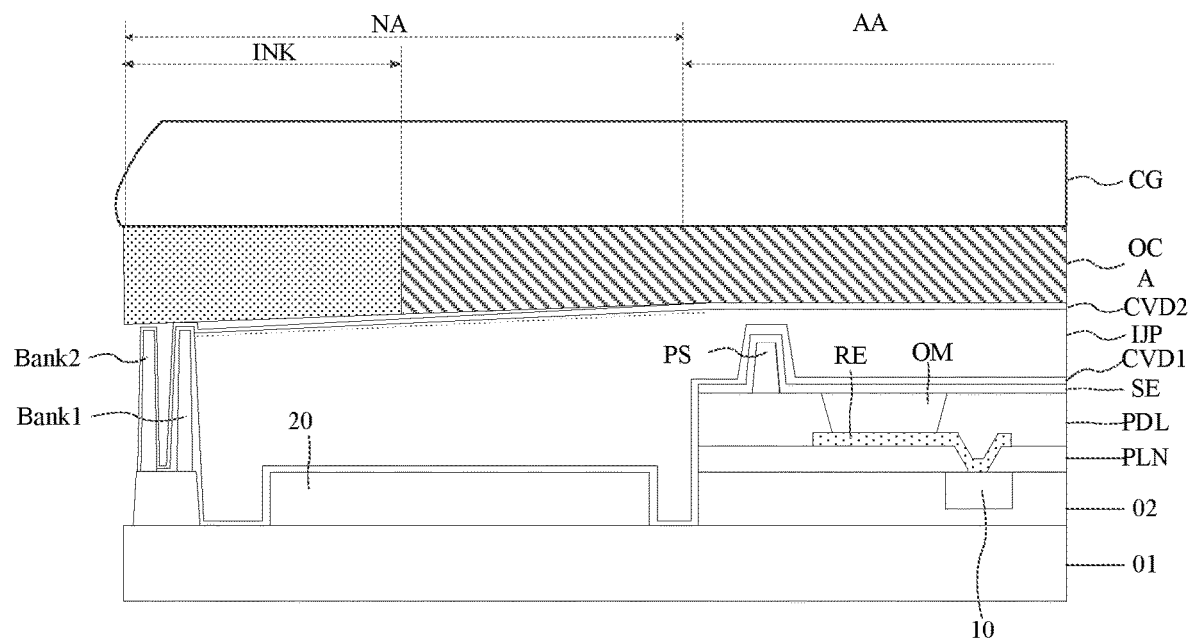
FIG. 5 illustrates a cross-section view of an exemplary display panel along an A-A direction in FIG. 1, consistent with various disclosed embodiments in the present disclosure.
Figure 6:
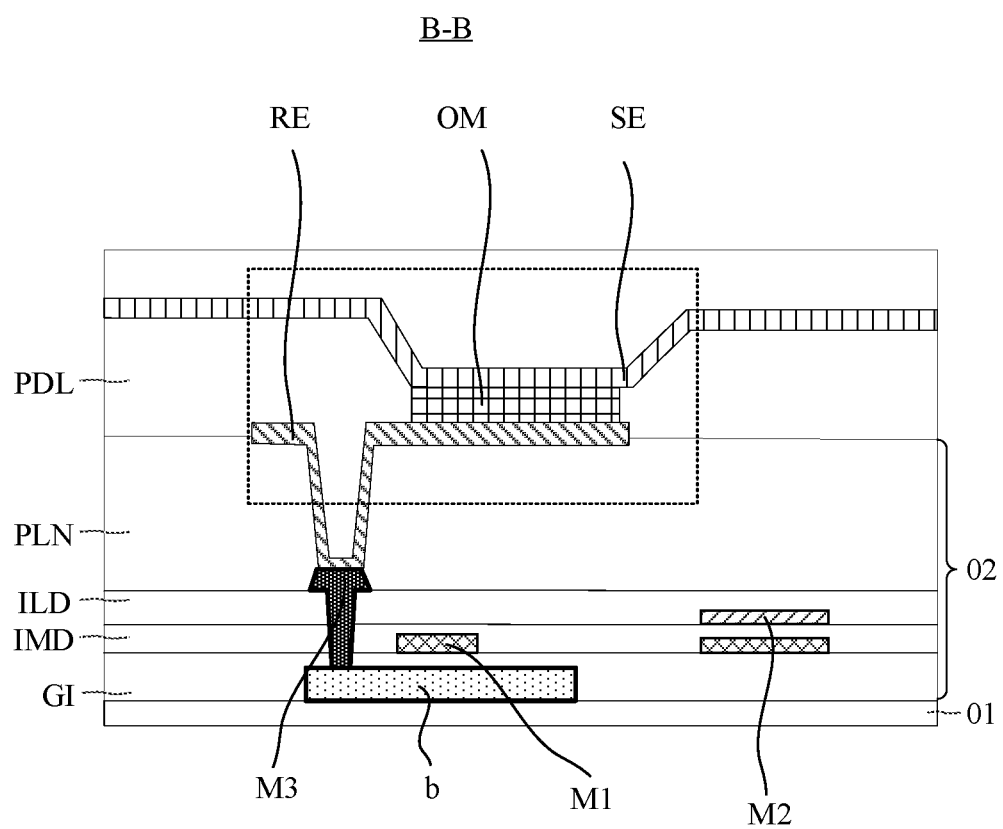
FIG. 6 illustrates a cross-section view of an exemplary display panel along a B-B direction in FIG. 1 consistent with various disclosed embodiments in the present disclosure.

As shown in FIG. 5 and FIG. 6, the non-display area NA may include an ink area INK. Exemplarily, the display panel 100 may include a substrate 01 and a driving device layer 02 disposed on a side of the substrate 01. As shown in FIG. 5, the display panel may also include a planarization layer PLN, a pixel definition layer PDL, light-emitting elements (each including an anode RE, organic light-emitting layer OM and a cathode SE), support pillars PS, a thin film encapsulation layer (including a first inorganic layer CVD1, an organic layer IJP, and a second inorganic layer CVD2), an optical adhesive layer OCA, and a cover plate CG. Further, as shown in FIG. 5, the display panel may also include the gate drive circuit 20, a first barrier wall Bank1, and a second barrier wall Bank2. The gate driving circuit 20 may be disposed in the non-display area of the driving device layer 02.

The pixel circuits 10 may be disposed in the driving device layer 02, and may be electrically connected to the anodes RE of the light-emitting elements. As shown in FIG. 6, the driving device layer 02 of the display panel 100 may include a first metal layer M1, a second metal layer M2, and a third metal layer M3 stacked in a direction away from the substrate 01. A semiconductor layer b may be provided between the first metal layer M1 and the substrate 01. Insulating layers may be provided between the metal layers and between the semiconductor layer b and the first metal layer M1. Exemplarily, a gate insulating layer GI may be provided between the first metal layer M1 and the semiconductor layer b, a capacitor insulating layer IMD may be provided between the second metal layer M2 and the first metal layer M1, and an interlayer dielectric layer ILD is provided between the third metal layer M3 and the second metal layers M2.

FIG. 5 and FIG. 6 are only used as examples to illustrate the present disclosure, and are not used to limit the scope of the present disclosure.

Exemplarily, the scan signal lines 11 and the light emission control signal lines (not shown in FIG. 1) may be disposed at the first metal layer M1. The reset signal lines 34 may be disposed at the second metal layer M2, and the power signal lines 33 and the data signal lines 32 may be disposed at the third metal layer M3. Of course, the film layer where each signal line is located may also be arranged in other ways, which is not limited in the present disclosure.

Figure 7:
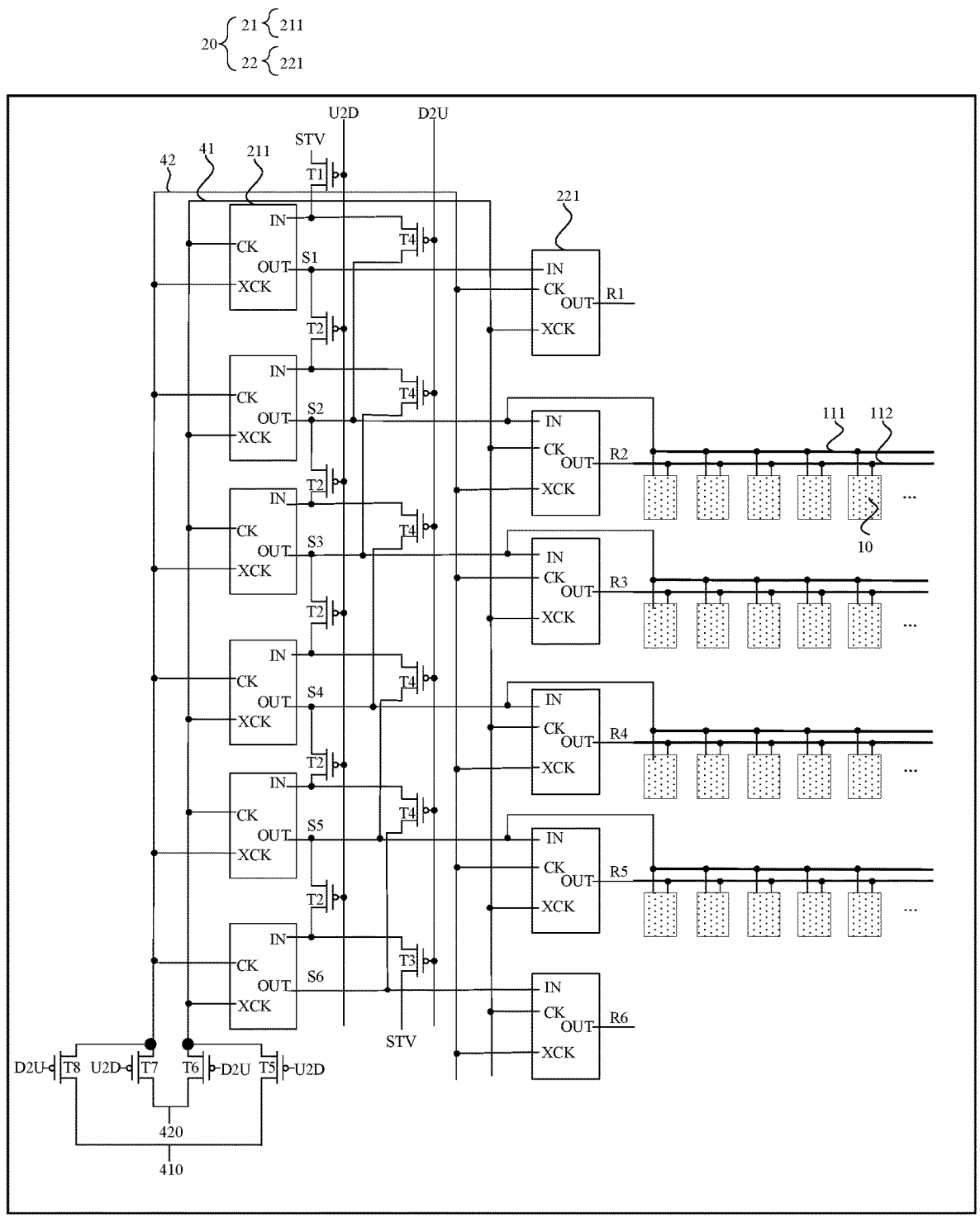
FIG. 7 illustrates another exemplary display panel consistent with various disclosed embodiments in the present disclosure.

In some embodiments, as shown in FIG. 7, the gate driving circuit 20 may further include a second gate driving circuit 22, and the second gate driving circuit 22 may include N stages of second shift register units 221 in a cascaded connection. The first shift register units 211 and the second shift register units 221 may have same circuit structures. It can be understood that the circuit structure of each of first shift register units 211 may be the same, and the circuit structure of each of second shift register units 221 may be the same. The specific circuit structures of each first shift register unit 211 and each second shift register unit 221 are not limited in the present disclosure.

The signal output terminal OUT of the k-th stage first shift register unit 211 may be electrically connected to the trigger signal input terminal IN of the k-th stage second shift register unit 221, where 1≤k≤N and k is a positive integer. In FIG. 7, the embodiment where N is 6 is used as an example to illustrate the present disclosure, and does not limit the scope of the present disclosure. It can be understood that the signal output terminal OUT of the first stage first shift register unit 211 may be electrically connected to the trigger signal input terminal IN of the first stage second shift register unit 221, and the output signal of the first stage first shift register unit 211 may be used as the trigger signal of the first stage second shift register unit 221; the signal output terminal OUT of the second stage first shift register unit 211 may be electrically connected to trigger signal input terminal IN of the second stage second shift register unit 221, and the output signal of the second stage first shift register unit 211 may be used as the trigger signal of the second stage second shift register unit 221; and so on.

Further, it is understandable that the output signal of the k-th stage first shift register unit 211 may be not only used as the trigger signal of the k-th stage second shift register unit 221, but also used as the trigger signal of the (k+1)-th stage first shift register unit 211.

In one embodiment, except the first stage second shift register unit 221 and the N-th stage second shift register unit 221, the signal output terminals OUT of the second stage second shift register unit 221 to the (N−1)-th stage second shift register unit 221 may be electrically connected to the pixel circuits 10 through scanning signal lines, and the second stage second shift register unit 221 to the (N−1)-th stage second shift register unit 221 may provide scanning signals for each row of the pixel circuits 10.

The gate driving circuit 20 usually need to be driven by a clock signal to output the scan signal. As shown in FIG. 7, the display panel 100 may further include at least a first clock signal line 41 and a second clock signal line 42. The first shift register units 211 and the second shift register units 221 may be both connected to the first clock signal line 41 and the second clock signal line 42. The first clock signal line 41 may be electrically connected to the first clock signal terminal 410 through the fifth switch element T5, and the first clock signal line 41 may be electrically connected to the second clock signal terminal 420 through the sixth switch element T6. The second clock signal line 42 may be electrically connected to the second clock signal terminal 420 through the seventh switch element T7, and the second clock signal line 42 may be electrically connected to the first clock signal terminal 410 through the eighth switch element T8. Control terminals of the fifth switch element T5 and the seventh switch element T7 may be electrically connected to the forward scanning control signal terminal U2D, and control terminals of the sixth switch element T6 and the eighth switch element T8 may be both electrically connected to the reverse scanning control signal terminal D2U. When the first clock signal terminal 410 outputs a turn-on electrical level, the second clock signal terminal 420 may output a cut-off electrical level; and when the second clock signal terminal 420 outputs a turn-on electrical level, the first clock signal terminal 410 may output a cut-off electrical level. In FIG. 7, the embodiment where N is equal to 6 and M is equal to 4 is used as an example only to illustrate the present disclosure, and does not limit the scope of the present disclosure. In various embodiments, the specific values of M and N may be set according to actual needs. Further, in some other embodiments, the first clock signal terminal 410 and the second clock signal terminal 420 may also be arranged in the bonding area NA1 of the display panel 100.

For description purposes only, the embodiments where an order of the first shift register unit of each stage and an order of the second shift register unit of each stage are the forward scanning direction are used as examples to illustrate the present disclosure, and do not limit the scope of the present disclosure.

Figure 8:
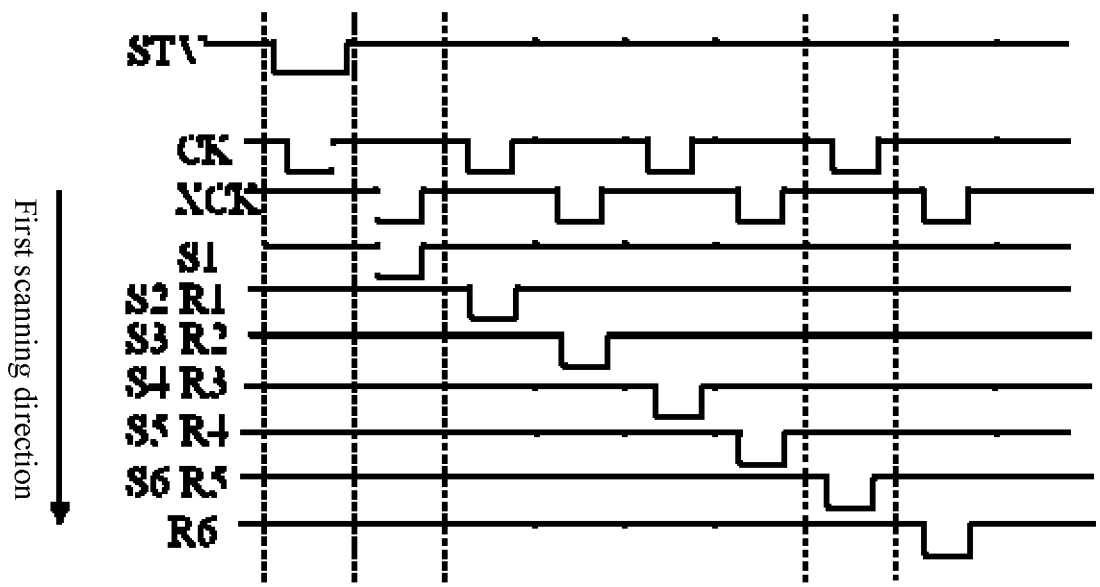
FIG. 8 illustrates a timing diagram corresponding to FIG. 7 consistent with various disclosed embodiments in the present disclosure.

Exemplarily, the forward scan control signal terminal U2D may be controlled to output a turn-on electrical level, and the reverse scan control signal terminal D2U may be controlled to output a cut-off electrical level, such that the first switch element T1, the second switch element T2, the fifth switch element T5, and the seventh switch element T7 may be turned on, the third switch element T3, the fourth switch element T4, the sixth switch element T6, and the eighth switch element T8 may be turned off. Correspondingly, the scanning direction of the gate driving circuit 20 may be the first scanning direction. The first scanning direction may be understood as the forward scanning direction. As shown in FIG. 8, the signal provided by the trigger signal terminal STV may serve as the trigger signal of the first stage first shift register unit S1, the output signal of the first stage first shift register unit S1 may serve as the trigger signal of the second stage first shift register unit S2 and the trigger signal of the first stage second shift register unit R1, and the output signal of the first shift register unit S2 of the second stage may serve as the trigger signal of the third stage first shift register unit S3 and the second stage second shift register unit R2, and so on. The first stage first shift register unit S1 to the sixth stage first shift register unit S6 may sequentially output scan signals, and the first stage second shift register unit R1 to the sixth stage second shift register unit R6 may also output scanning signals sequentially, to realize the stage transmission of the scanning signals in the forward scanning direction. It can be understood that in the first scanning direction, the output signals of the second stage first shift register unit S2 and the first stage second shift register unit R1 may be the same, and the output signals of the third stage first shift register unit S3 and the second stage second shift register unit R2 may be the same, and so on.

In the reverse scanning direction, the signal provided by the trigger signal terminal 31 may serve as the trigger signal of the N-th stage first shift register unit 211, the output signal of the j-th stage first shift register unit 211 may serve as the trigger signal of the (j−1)-th stage first shift register unit 211, to realize the stage transmission of the scanning signals in the reverse scanning direction.

Figure 9:
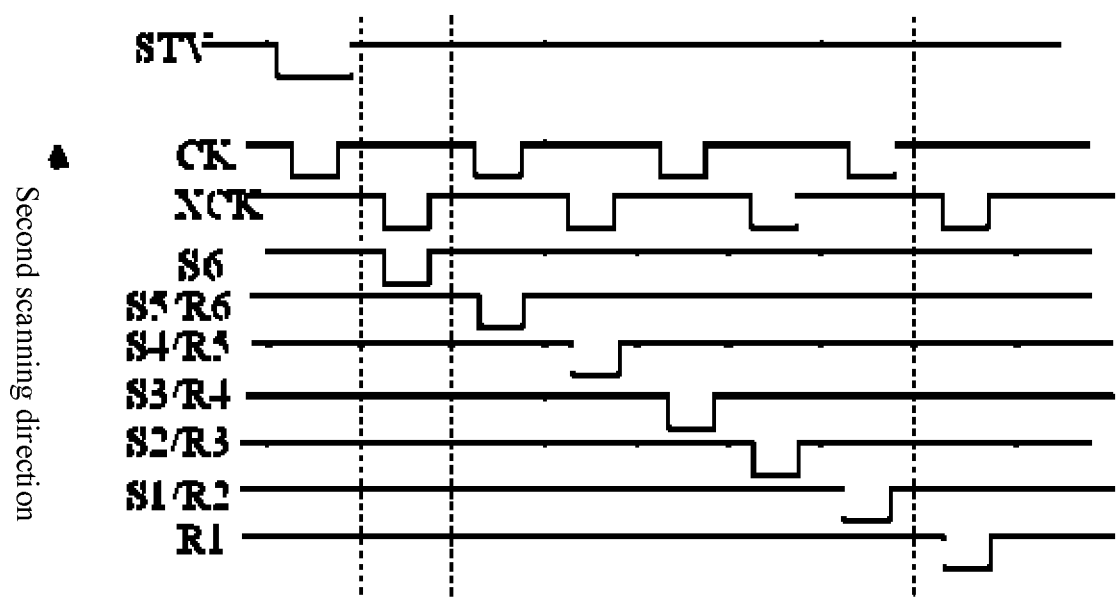
FIG. 9 illustrates another timing diagram corresponding to FIG. 7 consistent with various disclosed embodiments in the present disclosure.

Exemplarily, the forward scan control signal terminal U2D may be controlled to output a cut-off electrical level, and the reverse scan control signal terminal D2U may be controlled to output a turn-on electrical level, such that the first switch element T1, the second switch element T2, the fifth switch element T5, and the seventh switch element T7 may be turned off, the third switch element T3, the fourth switch element T4, the sixth switch element T6, and the eighth switch element T8 may be turned on. Correspondingly, the scanning direction of the gate driving circuit 20 may be the second scanning direction. The second scanning direction may be understood as the reverse scanning direction. As shown in FIG. 9, the signal provided by the trigger signal terminal STV may serve as the trigger signal of the sixth stage first shift register unit S6, the output signal of the sixth stage first shift register unit S6 may serve as the trigger signal of the fifth stage first shift register unit S5 and the trigger signal of the sixth stage second shift register unit R6, and the output signal of the fifth stage first shift register unit S5 may serve as the trigger signal of the fourth stage first shift register unit S4 and the fifth stage second shift register unit R5, and so on. The sixth stage first shift register unit S6 to the first stage first shift register unit S1 may sequentially output scan signals, and the sixth stage second shift register unit R6 to the first stage second shift register unit R1 may also output scanning signals sequentially, to realize the stage transmission of the scanning signals in the reverse scanning direction. It can be understood that in the second scanning direction, the output signals of the fifth stage first shift register unit S5 and the sixth stage second shift register unit R6 may be the same, and the output signals of the fourth stage first shift register unit S4 and the fifth stage second shift register unit R5 may be the same, and so on.

In the present disclosure, by providing the first switch element to the eighth switch element, it may be only necessary to control the on and off conditions of the first switch element to the eighth switch element in different scanning directions, and there may be no need to change the signals provided by the trigger signal terminal STV, the first clock signal terminal 410 and the second clock signal terminal 420. Correspondingly, in the forward scanning direction, the first stage first shift register unit to the N-th stage first shift register unit may sequentially output the scanning signal, and the first stage second shift register unit to the N-th stage second shift register unit may sequentially output the scan signals. In the reverse scanning direction, the N-th stage first shift register unit to the first stage first shift register unit may sequentially output the scan signals, and the N-th stage second shift register unit to the first stage second shift register unit may sequentially output scan signals. There may be no need to re-download the codes corresponding to the trigger signal terminal and each clock signal terminal, thereby further solving the problem that the display panel cannot realize the instant switching between the forward scanning and reverse scanning functions.

In some optional embodiments, the first switch element to the eighth switch element may all be thin film transistors. The control terminals of the first switch element to the eighth switch element may be gates of the first switch element to the eighth switch element. Usually, the plurality of first shift register units and the plurality of second shift register units may also include thin film transistors, such that the first to eighth switch elements and the plurality of first shift register units and the plurality of second shift register units may be formed at the same time, to simplify the process steps.

For example, in one embodiment, the first switch element to the eighth switch element may all be P-type transistors, or the first switch element to the eighth switch element may all be N-type transistors, or the type of the transistors of the first switch element to the eighth switch element may be the same as the transistor type in the gate drive circuit.

In some embodiments, as shown in FIG. 7, each of the first shift register units 211 and each of the second shift register units 221 may include a first clock signal input terminal CK and a second clock signal input terminal XCK. The first clock signal input terminal CK of the first shift register unit 211 of the odd-numbered stage and the first clock signal input terminal CK of the second shift register unit 221 of the even-numbered stage may be electrically connected to the first clock signal line 41, and the second clock signal input terminal XCK of the first shift register unit 211 of the odd-numbered stage and the second shift register unit 221 of the even-numbered stage may be electrically connected to the second clock signal line 42. The first clock signal input terminal CK of the first shift register unit 211 of the even-numbered stage and the second shift register unit 221 of the odd-numbered stage may be electrically connected to the second clock signal line 42, and the second clock signal input terminal XCK of the first shift register unit 211 of the even-numbered stage and the second shift register unit 221 of the odd-numbered stage may be electrically connected to the first clock signal line 41.

For description purposes only, the embodiment shown in FIG. 7 where an order of the shift register units of the odd-numbered stages and the even-numbered stages are the forward scanning direction are used as examples to illustrate the present disclosure, and do not limit the scope of the present disclosure.

For example, in one embodiment, N may be 6. The first clock signal input terminals CK of the first shift register units S1, S3, S5 of odd-numbered stages may be electrically connected to the first clock signal line 41, and the second clock signal input terminal XCK of the first shift register units S1, S3, S5 of the odd-numbered stages may be electrically connected to the second clock signal line 42. The first clock signal input terminals CK of the first shift register units S2, S4, S6 of the even-numbered stage may be all electrically connected to the second clock signal line 42, and the second clock signal input terminals XCK of the first shift register units S2, S4, S6 of the even-numbered stage may be all electrically connected to the first clock signal line 41. The first clock signal input terminals CK of the second shift register units R1, R3, R5 of the odd-numbered stage may be all electrically connected to the second clock signal line 42, and the second clock signal terminals of the second shift register units R1, R3, R5 of the odd-numbered stage may be all electrically connected to the first clock signal line 41. The first clock signal input terminals CK of the second shift register units R2, R4, R6 of the even-numbered stage may be all electrically connected to the first clock signal line 41, and the second clock signal terminals of the second shift register units R2, R4, R6 of the even-numbered stage may be all electrically connected to the second clock signal line 42.

As shown in FIG. 7, in the first scanning direction, that is, in the forward scanning direction, the forward scanning control signal terminal U2D may be controlled to output a turn-on electrical level, and the reverse scanning control signal terminal D2U may be controlled to output a cut-off electrical level. The fifth switch element T5 and the seventh switch element T7 may be turned on. The clock signal of the first clock signal terminal 410 may be transmitted to the first clock signal line 41 through the fifth switch element T5, and the clock signal of the second clock signal terminal 420 may be transmitted to the second clock signal line 42 through the seventh switch element T7. In the second scanning direction, that is, in the reverse scanning direction, the forward scanning control signal terminal U2D may be controlled to output a cut-off electrical level, and the reverse scanning control signal terminal D2U may be controlled to output a conducting electrical level. The sixth switch element T6 and the eighth switch element T8 may be turned on. The clock signal of the first clock signal terminal 410 may be transmitted to the second clock signal line 42 through the eighth switch element T8, and the clock signal of the second clock signal terminal 420 may be provided to the first clock signal line 41 through the sixth switch element T6.

In the present embodiment, by adding the fifth switch element T5 and the seventh switch element T7 controlled by the forward scanning control signal terminal U2D, and the sixth switch element T6 and the eighth switch element T8 controlled by the reverse scanning control signal terminal D2U, under the connection relationship between the first clock signal line 41 and the second clock signal line 42 and the first shift register unit 211 and the second shift register unit 221, there may be no need to switch the clock signals of the first clock signal terminal 410 and the second clock signal terminal 420 for realizing the switching of the clock signals on the first clock signal line 41 and the second clock signal line 42, thereby solving the technical problem that the display panel cannot realize the instant switching of the forward and reverse scanning functions.

The pixel circuits 10 may usually include driving transistors. To improve the display uniformity, the driving transistors may usually need to be reset before the data signal is written into the pixel circuits. Therefore, to ensure the normal operation of the pixel circuits 10, it may be necessary to provide two types of scanning signals for the pixel circuits. As shown in FIG. 7, to ensure that each row of plurality of pixel circuits 10 is able to receive two scanning signals in the forward scanning direction and the reverse scanning direction, the relationship between N and M may need to be set to N−M≥2. That is, the difference between the number of the plurality of first shift register units 211, the number of the plurality of second shift register units 221, and the number of rows of the the pixel circuits 10 may be larger than or equal to 2. It can be understood that the number of the plurality of first shift register units 211 may be equal to the number of the plurality of second shift register units 221. For example, the number of the plurality of first shift register units 211 and the number of the plurality of second shift register units 221 may be both 6, and the number of rows of the pixel circuits 10 may be 4.

In some embodiments shown in FIG. 7, the scanning signal lines 11 may at least include first scan lines 111 and second scan lines 112. Signals on the first scan lines 111 may control the first reset signal Vref1 to be written into the gates of the driving transistors of the pixel circuits 10. Signals on the second scan lines 112 may control the data signals to be written into the pixel circuits 10.

Figure 10:
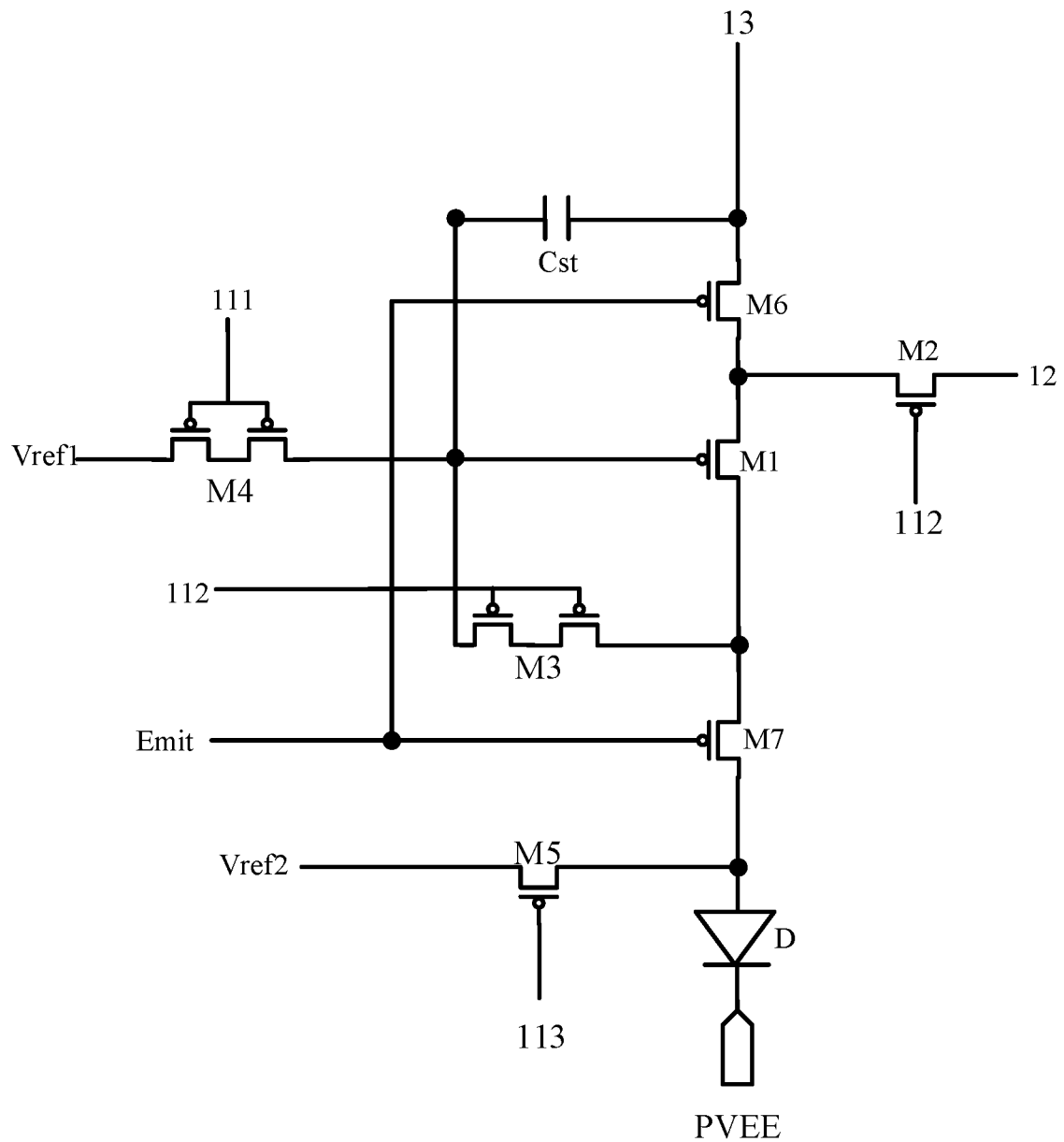
FIG. 10 illustrates a circuit structure of a pixel circuit in an exemplary display panel consistent with various disclosed embodiments in the present disclosure.

In one embodiment, as shown in FIG. 9, each pixel circuit 10 of the pixel circuits 10 may include seven transistors and a storage capacitor, and the connection mode of each component in the pixel circuit 10 is shown in FIG. 10, which will not be described in detail again. In FIG. 10, the driving transistor is marked as M1, the light-emitting element is marked as D, PVEE is a common power signal line, and is electrically connected to the negative voltage signal terminal. Vref1 represents the first reset signal, and Vref2 represents the second reset signal. Both Vref1 and Vref2 are negative voltage signals. The values of Vref1 and Vref2 may be the same. When the values of Vref1 and Vref2 are the same, the same reset signal line 14 may be used to provide a reset signal to the pixel circuit 10. Emit represents the light-emitting control signal.

Figure 11:
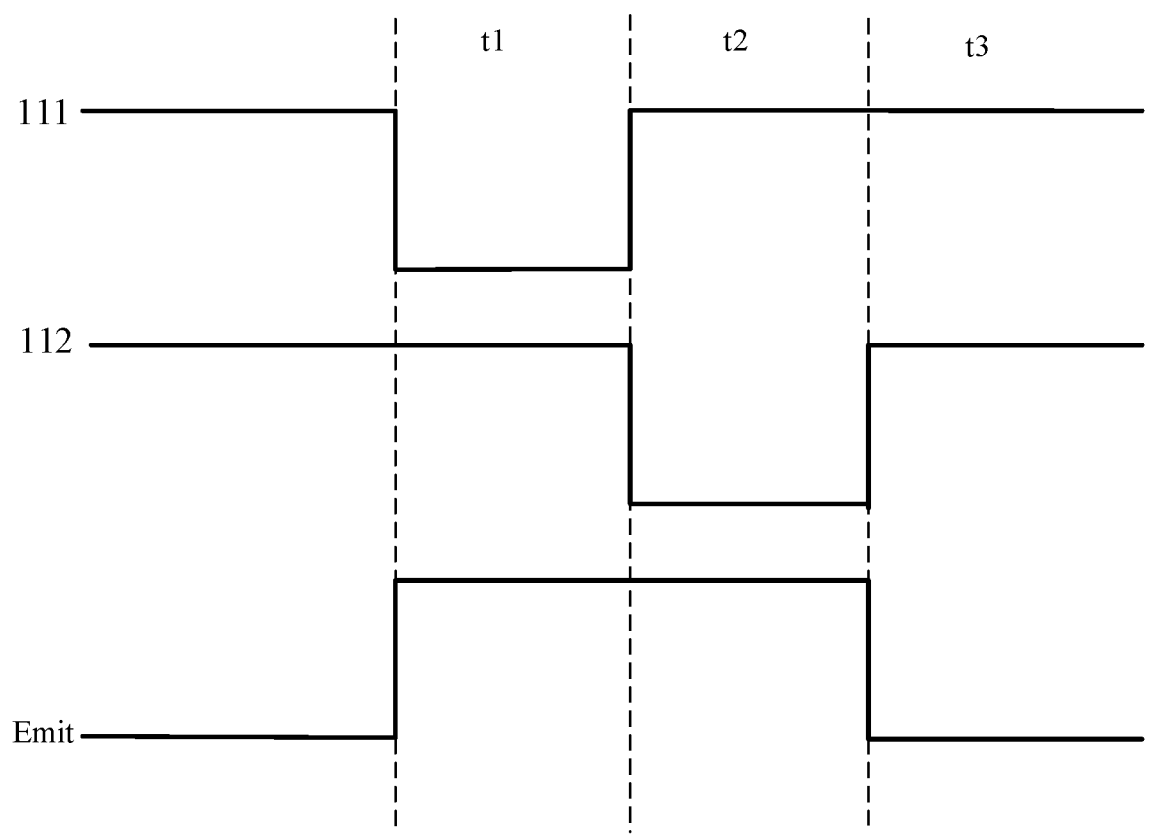
FIG. 11 illustrates a timing diagram corresponding to FIG. 10 consistent with various disclosed embodiments in the present disclosure.
Figure 12:
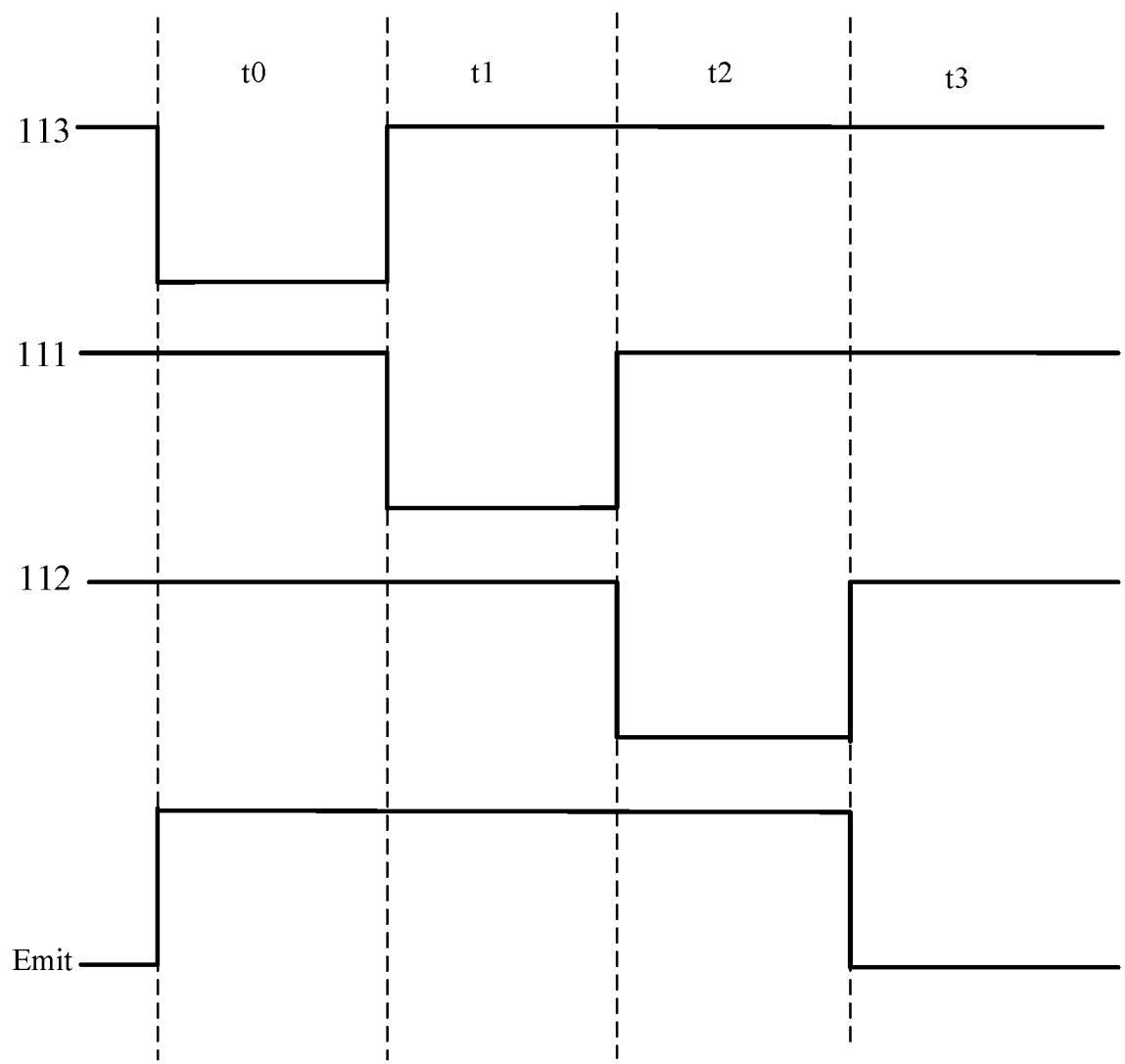
FIG. 12 illustrates another timing diagram corresponding to FIG. 10 consistent with various disclosed embodiments in the present disclosure.

As shown in FIG. 11, the working process of the pixel circuit 10 may include a reset phase t1, a data writing phase t2, and a light emitting phase t3. Taking the pixel circuit 10 where each transistor in the pixel circuit is turned on at a low electrical level as an example, in the reset phase t1, the first scan line 111 may provide a low electrical level, the transistor M4 may be turned on, and the first reset signal Vref1 may be transmitted to the gate of the driving transistor M1 to reset the gate of the driving transistor M1. In the data writing phase t2, the second scan line 112 may provide a low electrical level, the transistor M2 and the transistor M3 may be turned on, the data signal on the data signal line 12 may be transmitted to the gate of the driving transistor M1, and the threshold voltage of the driving transistor M1 may be compensated. As shown in FIG. 11, the gate of the transistor M5 may be electrically connected to the third scan line 113, and the signal on the third scan line 113 may be the same as the signal on any one of the first scan line 111 and the second scan line 112. In another embodiment, as shown in FIG. 12, the working process of the pixel circuit 10 may further include an initial reset stage t0. The third scan line 113 may be at a low electrical level during the initial reset stage t0, and the low electrical level on the third scan line 113 may be before the low electrical level on the first scan line 111 and the second scan line 112. The transistor M5 may be used to transmit the second reset signal Vref2 to the anode of the light-emitting element D when it is turned on, and reset the anode of the light-emitting element D. In the light-emitting stage t3, the light-emitting control signal Emit may be low, the transistor M6 and the transistor M7 may be turned on, the driving current generated by the driving transistor M1 may be transmitted to the light-emitting element D, and the light-emitting element D may emit light.

As shown in FIG. 7, the signal output terminal OUT of the a-th stage first shift register unit 211 may be electrically connected to the first scan line 111 corresponding to pixel circuits 10 of the pixel circuits 10 in the (a−1)-th row, and the signal output terminal of the a-th stage second shift register unit 221 may be electrically connected to the second scan line 112 corresponding to pixel circuits 10 of the pixel circuits 10 in the (a−1)-th row. N−M=2, 2≤a≤N−1, and a is a positive integer.

In one embodiment, taking N=6 and M=4 as an example, when a=2, the signal output terminal OUT of the second stage first shift register unit S2 may be electrically connected to the first scan line 111 corresponding to pixel circuits 10 of the pixel circuits 10 in the first row, and the signal output terminal OUT of the second stage second shift register unit R2 may be electrically connected to the second scan line 112 corresponding to pixel circuits 10 of the pixel circuits 10 in the first-th row. As shown in FIG. 8 and FIG. 9, in the first scanning direction or in the second scanning direction, the low-electrical level signals output by the second stage first shift register unit S2 may be before the low-electrical level signals output by the second stage second shift register unit R2. Correspondingly, it may be ensured that the pixel circuits 10 in the first row may work normally in the forward and reverse scanning directions. When a=3, the signal output terminal OUT of the third stage first shift register unit S3 may be electrically connected to the first scan line 111 corresponding to pixel circuits 10 of the pixel circuits 10 in the second row, and the signal output terminal OUT of the third stage second shift register unit R3 may be electrically connected to the second scan line 112 corresponding to pixel circuits 10 in the second row. As shown in FIG. 8 and FIG. 9, in the first scanning direction or in the second scanning direction, the low-electrical level signals output by the third stage first shift register unit S3 may be before the low-electrical level signals output by the third stage second shift register unit R3. Correspondingly, it may be ensured that the pixel circuits 10 in the second row can work normally in both the forward and reverse scanning directions. By analogy, it may be ensured that each row of the pixel circuits 10 can work normally in the forward and reverse scanning directions.

Figure 13:
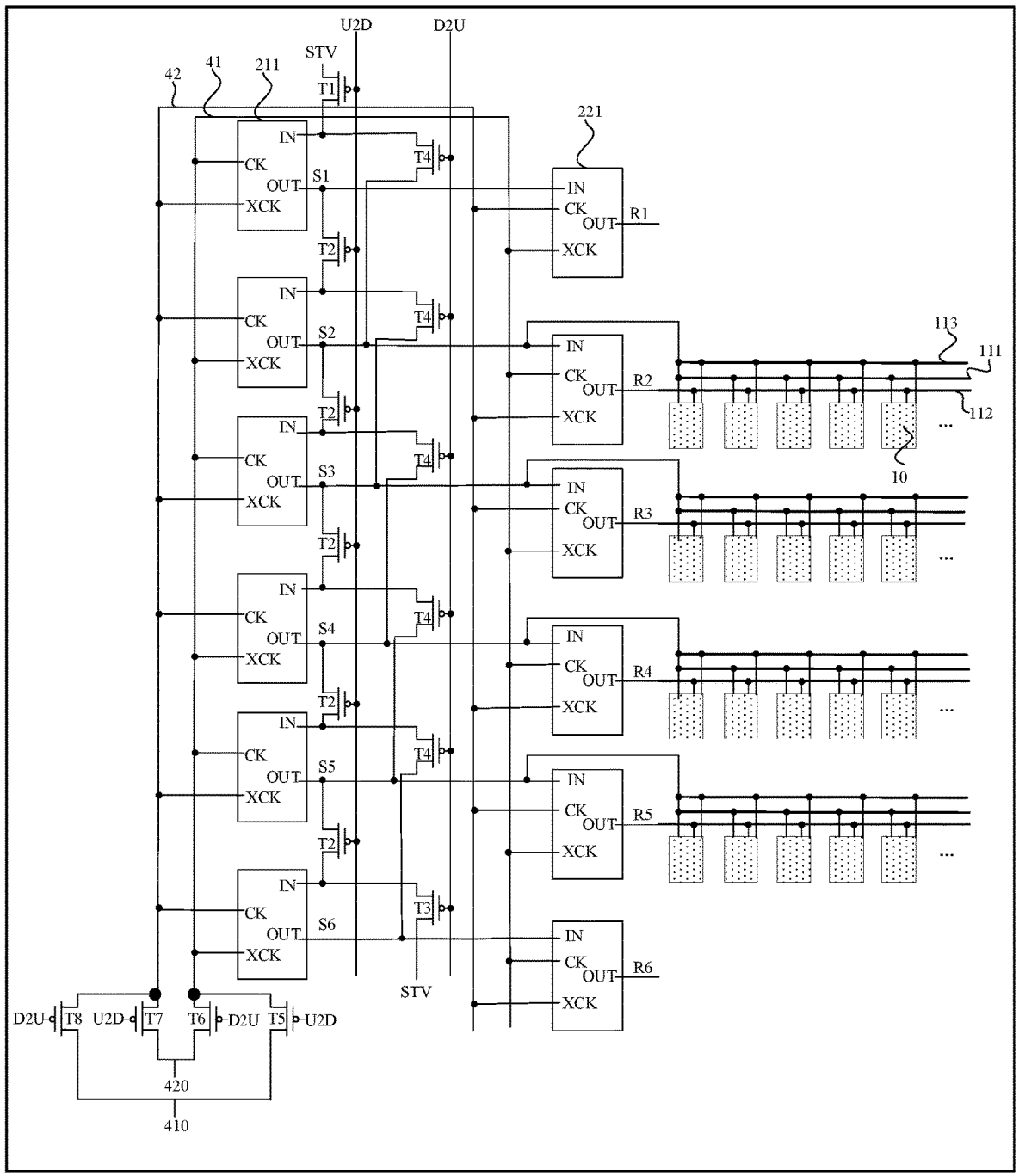
FIG. 13 to FIG. 20 illustrates other exemplary display panels consistent with various disclosed embodiments in the present disclosure.
Figure 14:
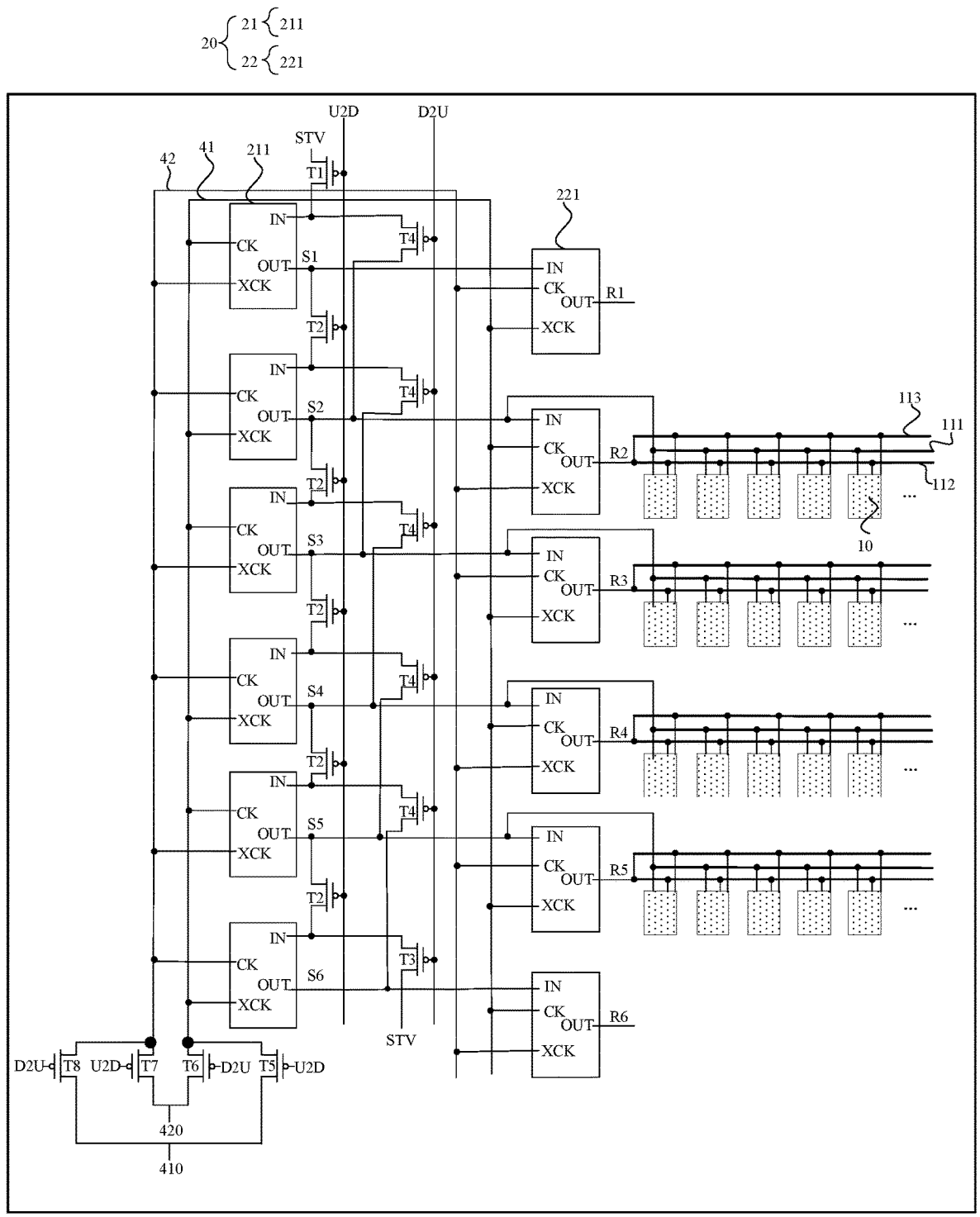
Figure 15:
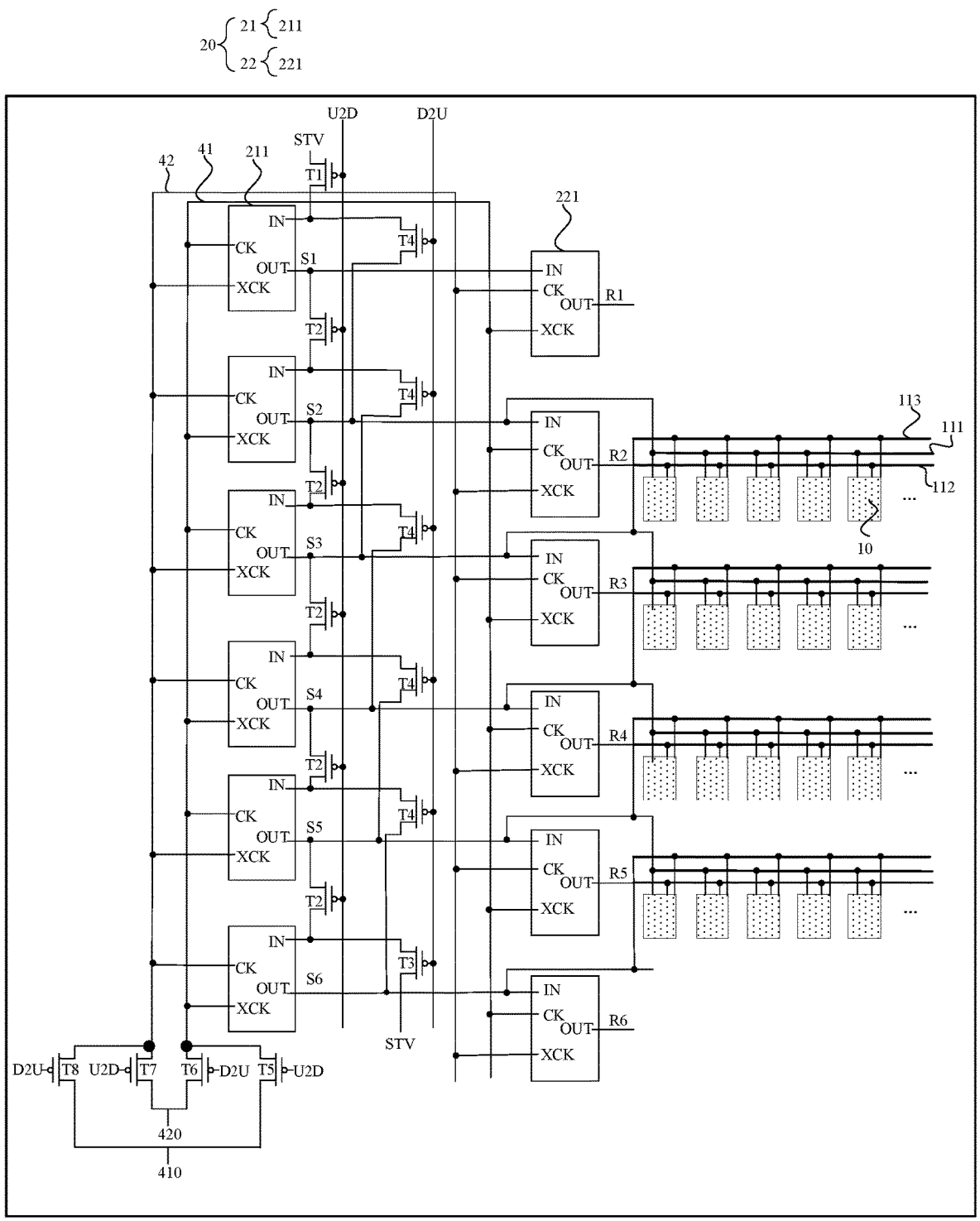

In some optional embodiments, as shown in FIGS. 13-15, the scan signal line 11 may further include a third scan line 113, and the signal on the third scan line 113 may be used to control the second reset signal Vref2 to be written into the anode of the light-emitting element D of the pixel circuits 10. It may be only necessary that the anode of the light-emitting element D is reset before the light-emitting stage t3. Correspondingly, the signal on the third scan line 113 may be the same as the scan signal on any one of the first scan line 111 and the second scan line 112.

For example, as shown in FIG. 13, the signal output terminal OUT of the a-th stage first shift register unit 211 may be electrically connected to the third scan line 113 corresponding to the pixel circuits 10 in the (a−1)-th row, that is, the signals on the third scan line 113 and the first scan line 111 corresponding to a same row of the pixel circuits 10 may be the same.

For another example, as shown in FIG. 14, the signal output terminal OUT of the a-th stage second shift register unit 221 may be electrically connected to the third scan line 113 corresponding to the pixel circuits 10 in the (a−1)-th row, that is, the signals on the third scan line 113 and the second scan line 112 corresponding to a same row of the pixel circuits 10 may be the same.

For another example, as shown in FIG. 15, the signal output terminal OUT of the (a+1)-th second shift register unit 221 may be electrically connected to the third scan line 113 corresponding to the pixel circuits 10 in the (a−1)-th row. Taking a=2 as an example, the signal output terminal OUT of the second stage first shift register unit S2 may be electrically connected to the first scan line 111 corresponding to the pixel circuits 10 of the first row, the signal output terminal OUT of the second stage second shift register unit R2 may be electrically connected to the second scan line 112 corresponding to the pixel circuits 10 in the first row, and the signal output terminal OUT of the third stage second shift register unit R3 may be electrically connected to the third row corresponding to the pixel circuits 10 of the first row. As shown in FIG. 8, in the first scanning direction, the third stage second shift register unit R3 and the second stage second shift register unit R2 may output the same signal. It can be understood that in the first scanning direction, the signals on the third scan line 113 and the second scan line 112 corresponding to the pixel circuits 10 in the same row may be the same. As shown in FIG. 9, in the second scanning direction, the low-electrical level signals output by the third stage second shift register unit R3 may be before the low-electrical level signals output by the second stage first shift register unit S2 and the second stage second shift register unit R2. Therefore, when the signal output terminal OUT of the (a+1)-th stage second shift register unit 221 is electrically connected to the third scan line 113 corresponding to the pixel circuits 10 in the (a−1)-th row, the pixel circuits 10 may also be guaranteed normal work.

Figure 16:
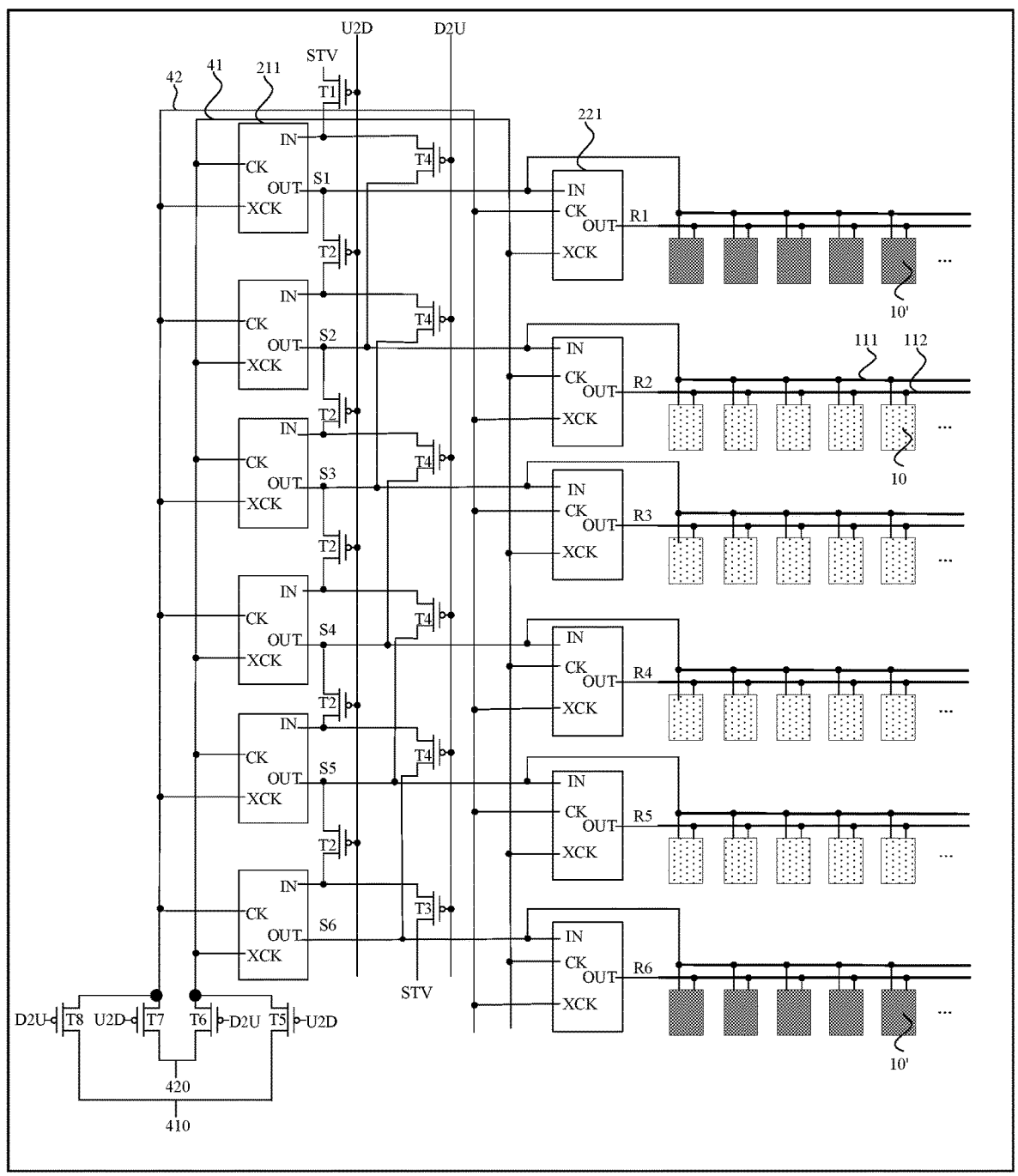

As mentioned above, to ensure that the pixel circuits 10 is able to work normally in both the forward and reverse scanning directions, the number of rows of the pixel circuits 10 may need to be set to be smaller than the number of stages of the plurality of first shift register units and the plurality of second shift register units. As shown in the FIG. 7 or as shown in FIGS. 13-15, the signal output terminal of the first stage second shift register unit R1 and the signal output terminal of the last stage second shift register unit R6 may be not electrically connected to the pixel circuits 10, and the signal output terminal of the first stage first shift register unit S1 may be also not electrically connected to the pixel circuits 10, which causes the load of the plurality of first shift register units 211 to be different and the load of the plurality of second shift register units 221 to be different. The uneven display may appear. To balance the loads of the plurality of first shift register units 211 and the plurality of second shift register units 221 and improve display uniformity, as shown in FIG. 16, the display panel 100 may further include dummy pixel circuits 10'. It can be understood that the dummy pixel circuits 10' may not emit light. The dummy pixel circuits 10' may be located in the non-display area of the display panel 100. At least one of the signal output terminal of the first stage first shift register unit S1, the signal output terminal of the first stage second shift register unit R1, or the signal output terminal of the last stage second shift register unit R6 may be electrically connected to the dummy pixel circuits 10'.

Further, as shown in FIG. 7, FIG. 13 or FIG. 14, the signal output terminal of the last stage first shift register unit S6 may be also not electrically connected to the pixel circuits 10, and the load of the signal output terminal of the last stage first shift register unit S6 may be also different from that of the first shift register units of other stages. Correspondingly, the signal output terminal of the last stage first shift register unit S6 may also be electrically connected to the dummy pixel circuits 10'.

For example, as shown in FIG. 16, the dummy pixel circuits 10' may be provided in two rows, and the signal output terminal of the first stage first shift register unit S1 and the signal output terminal of the first stage second shift register unit R1 may be electrically connected with one row of the pixel circuits 10'. The signal output terminal of the last stage first shift register unit S6 and the signal output terminal of the last stage second shift register unit R6 may be electrically connected to another row of the dummy pixel circuits 10'.

Figure 17:
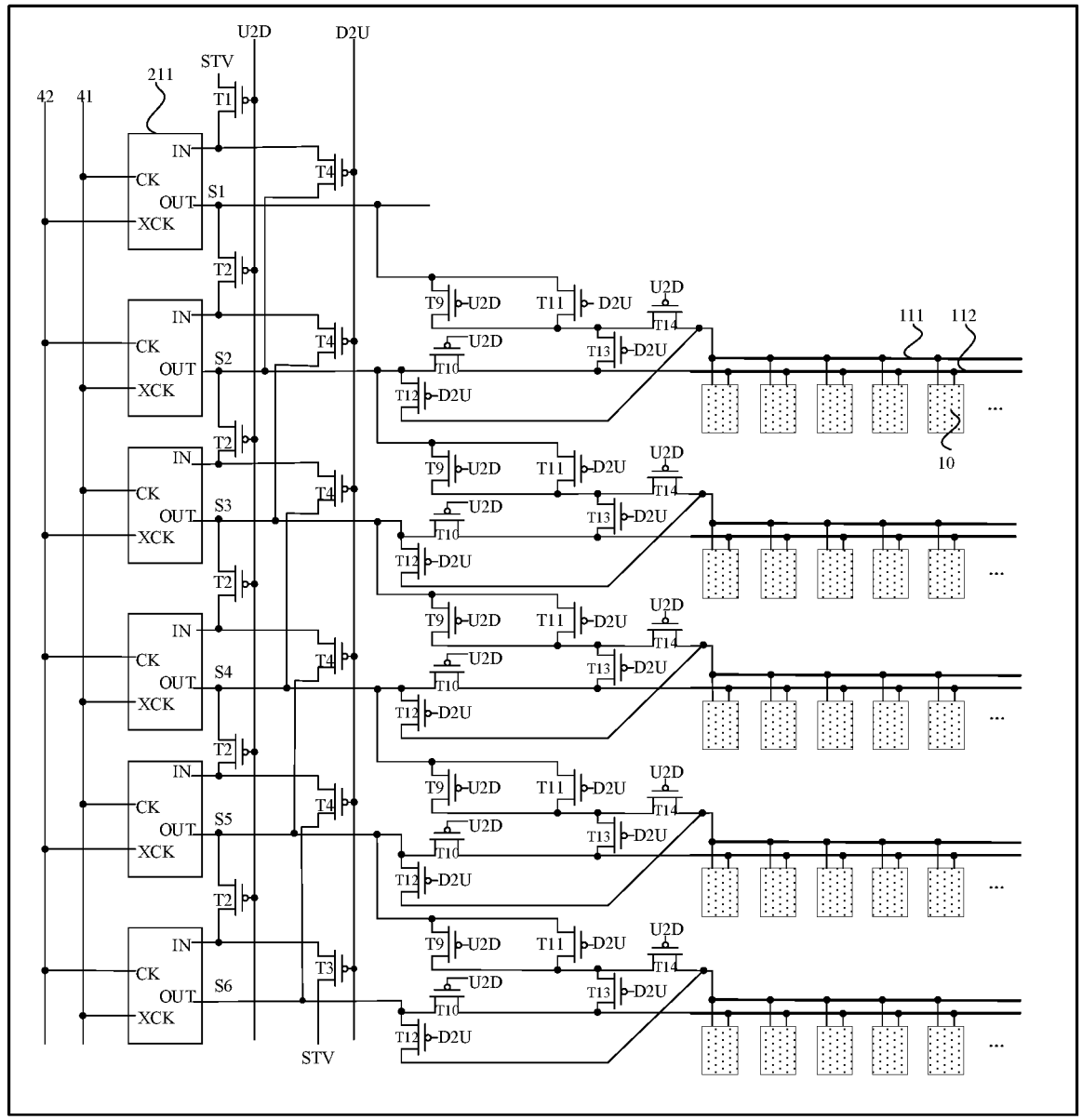

In some optional embodiments, as shown in FIG. 17, the scan signal line 11 may at least include a first scan line 111 and a second scan line 112, and the signal on the first scant line 111 may be used to control the first reset signal Vref1 to be written into the gates of the driving transistors in the pixel circuits 10, and the signal on the second scan line 112 may be used to control the data signal to be written into the pixel circuits 10. Each of the plurality of the pixel circuits 10 may have a circuit structure shown in FIG. 10 or FIG. 11, and may have a timing shown in FIG. 12. When the gate driving circuit 20 only includes the first gate driving circuit 21, a ninth switch element T9, a tenth switch element T10, an eleventh switching element T11, and a twelfth switch element T12 may be provided to switch connection from the first scan line 111 and the second scan line 112 to the first shift register unit of each stage, to achieve switching between scanning directions of the display panel.

Specifically, as shown in FIG. 17, the signal output terminal OUT of the i-th stage first shift register unit 211 may be electrically connected to the first scan line 111 corresponding to the i-th row of the pixel circuits 10 through the ninth switch element T9 and the fourteenth switch element T14 connected in series. The signal output terminal OUT of the (i+1)-th stage first shift register unit 211 may be electrically connected to the second scan line 112 corresponding to the i-th row of the pixel circuits 10 through the tenth switch element T10. Control terminals of the ninth switch element T9, the tenth switch element T10, and the fourteenth switch element T14 may be all electrically connected to the forward scanning control signal terminal U2D. As shown in FIG. 3, in the first scanning direction, that is, in the forward scanning direction, the forward scanning control signal terminal U2D may be controlled to output the turn-on electrical level, and the reverse scanning control signal terminal D2U may be controlled to output the cut-off electrical level. The first switch element T1, the second switch element T2, the ninth switch element T9, the tenth switch element T10, and the fourteenth switch element T14 may be turned on, and the stage transmission direction of the scanning signal may be from the i-th stage first shift register unit 211 to the (i+1)-th stage first shift register unit 211. The low electrical level output from the signal output terminal OUT of the i-th stage first shift register unit 211 may be before the low electrical level output from the signal output terminal OUT of the (i+1)-th stage first shift register unit 211. The signal output from the signal output terminal OUT of the i-th stage first shift register unit 211 may be transmitted on the first scan line 111 corresponding to the i-th row of the pixel circuits 10, and the second scan line 112 corresponding to the i-th row of the pixel circuits 10 may transmit the signal output from the signal output terminal OUT of the (i+1)-th stage first shift register unit 211, to realize the forward scanning of the display panel.

The signal output terminal OUT of the i-th stage first shift register unit 211 may be electrically connected to the second scan line 112 corresponding to the i-th row of the pixel circuits 10 through the eleventh switch element T11 and the thirteenth switch element T14 connected in series. The signal output terminal OUT of the (i+1)-th stage first shift register unit 211 may be electrically connected to the second scan line 112 corresponding to the i-th row of the pixel circuits 10 through the twelfth switch element T10. Control terminals of the eleventh switch element T11, the twelfth switch element T12, and the thirteenth switch element T13 may be all electrically connected to the reverse scanning control signal terminal D2U. As shown in FIG. 4, in the second scanning direction, that is, in the reverse scanning direction, the reverse scanning control signal terminal D2U may be controlled to output the turn-on electrical level, and the forward scanning control signal terminal U2D may be controlled to output the cut-off electrical level. The third switch element T3, the fourth switch element T3, the eleventh switch element T11, the twelfth switch element T12, and the thirteenth switch element T13 may be turned on, and the stage transmission direction of the scanning signal may be from the (i+1)-th stage first shift register unit 211 to the i-th stage first shift register unit 211. In the present embodiment, the (i+1)-th stage first shift register unit 211 and the i-th stage first shift register unit 211 are labeled in the forward scanning direction. As an example, as shown in FIG. 17, N may be 6. When the third switch element T3 and the fourth switch element T4 are turned on, the stage transmission direction of the scanning signal may be from the sixth stage first shift register unit S6 to the fifth stage first shift register unit S5, and then from the fifth stage first shift register unit S5 to the fourth stage first shift register unit S4, and so on.

Taking the fifth row of the pixel circuits 10 as an example, the signal output terminal OUT of the fifth stage first shift register unit S5 may be electrically connected to the second scan line 112 corresponding to the fifth row of the pixel circuits 10 through the eleventh switch element T11 and the thirteenth switch element T13, and the signal output terminal OUT of the sixth stage first shift register unit 211 may be electrically connected to the first scan line 111 corresponding to the fifth row of the pixel circuits 10 through the twelfth switch element T12. As shown in FIG. 4, the low electrical level output by the signal output terminal OUT of the sixth stage first shift register unit S6 may be before the low electrical level output by the signal output terminal OUT of the fifth stage first shift register unit S5. The first scan line 111 corresponding the fifth row of the pixel circuits 10 may transmit the signal output by the signal output terminal OUT of the sixth stage first shift register unit S6, and the second scan line 112 corresponding the fifth row of the pixel circuits 10 may transmit the signal output from the signal output terminal OUT of the fifth stage first shift register unit S5, to realize reverse scanning of the display panel.

As shown in FIG. 17, to ensure that both in the forward scanning direction and the reverse scanning direction, each row of the pixel circuits 10 is able to receive two types of scanning signals, the relationship between N and M may be necessary to be set to N−M≥1. In other words, the difference between the number of the plurality of first shift register units 211 and the number of rows of the pixel circuits 10 is may be larger than or equal to one. Optionally, to set a larger resolution as much as possible, the difference between N and M may be set to 1. For example, the number of the plurality of first shift register unit 211 may be 6, and the number of rows of the pixel circuits 10 may be 5.

In some optional embodiments, the first to fourth switch elements, the ninth to fourteenth switch elements may all be thin film transistors. The control terminals of the first to fourth switch elements may be the gates of the first to fourth switch elements, and the control terminals of the ninth to fourteenth switch elements may be the gate of the ninth to fourteenth switch elements. As mentioned above, the plurality of first shift register units may also include thin film transistors. Correspondingly, thin film transistors in the first to fourth switch elements, the ninth to fourteenth switch elements, and the plurality of first shift register units may be formed at the same time, to simplify the process steps.

Exemplarily, the first to fourth switch elements, and the ninth to fourteenth switch elements may all be P-type transistors, or the first to fourth switch elements, and the ninth to fourteenth switch elements may all be N-type transistors, or the transistor types of the first to fourth switch elements and the ninth to fourteenth switch elements may be the same as the transistor types in the gate driving circuit.

Figure 18:
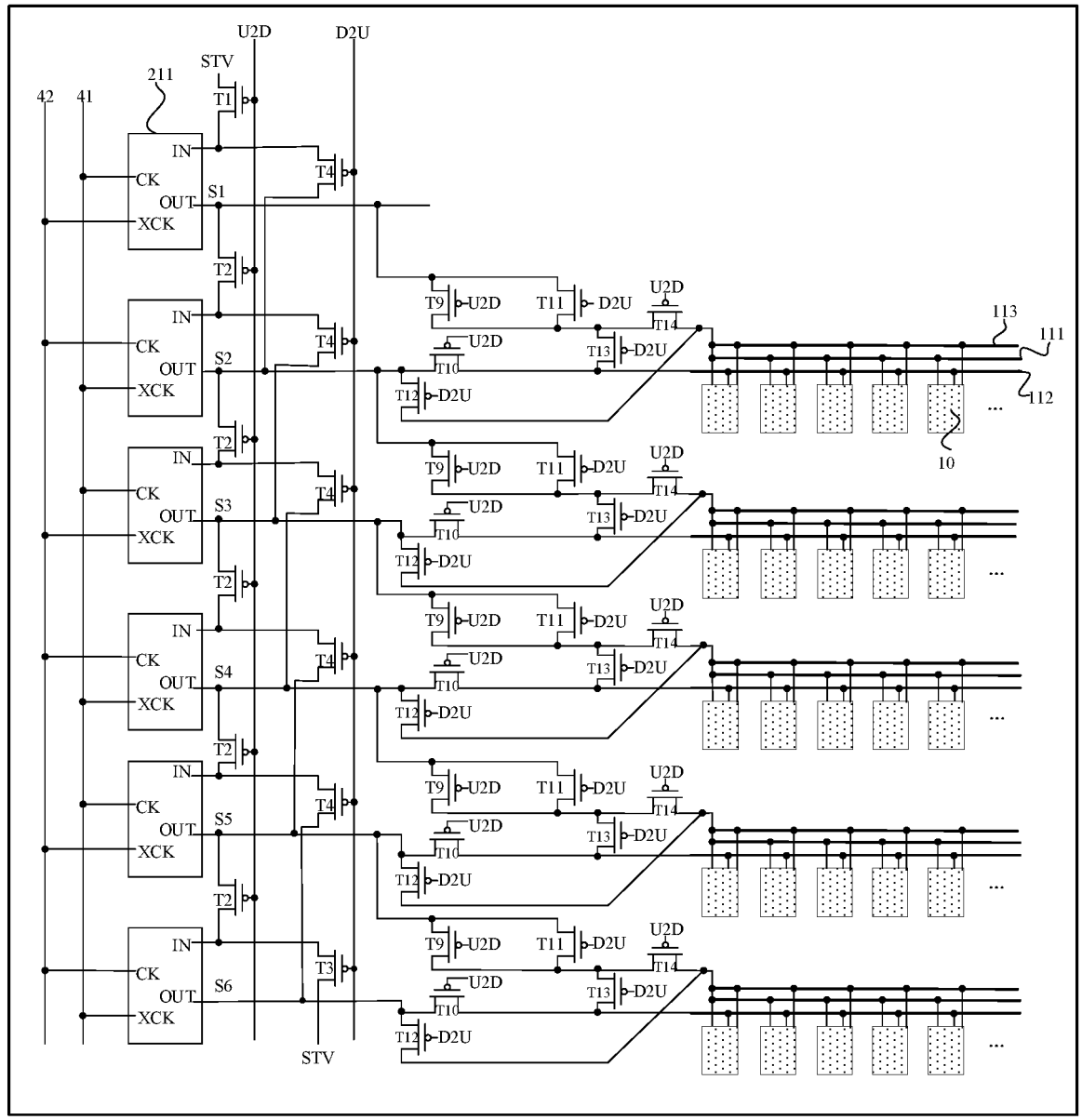
Figure 19:
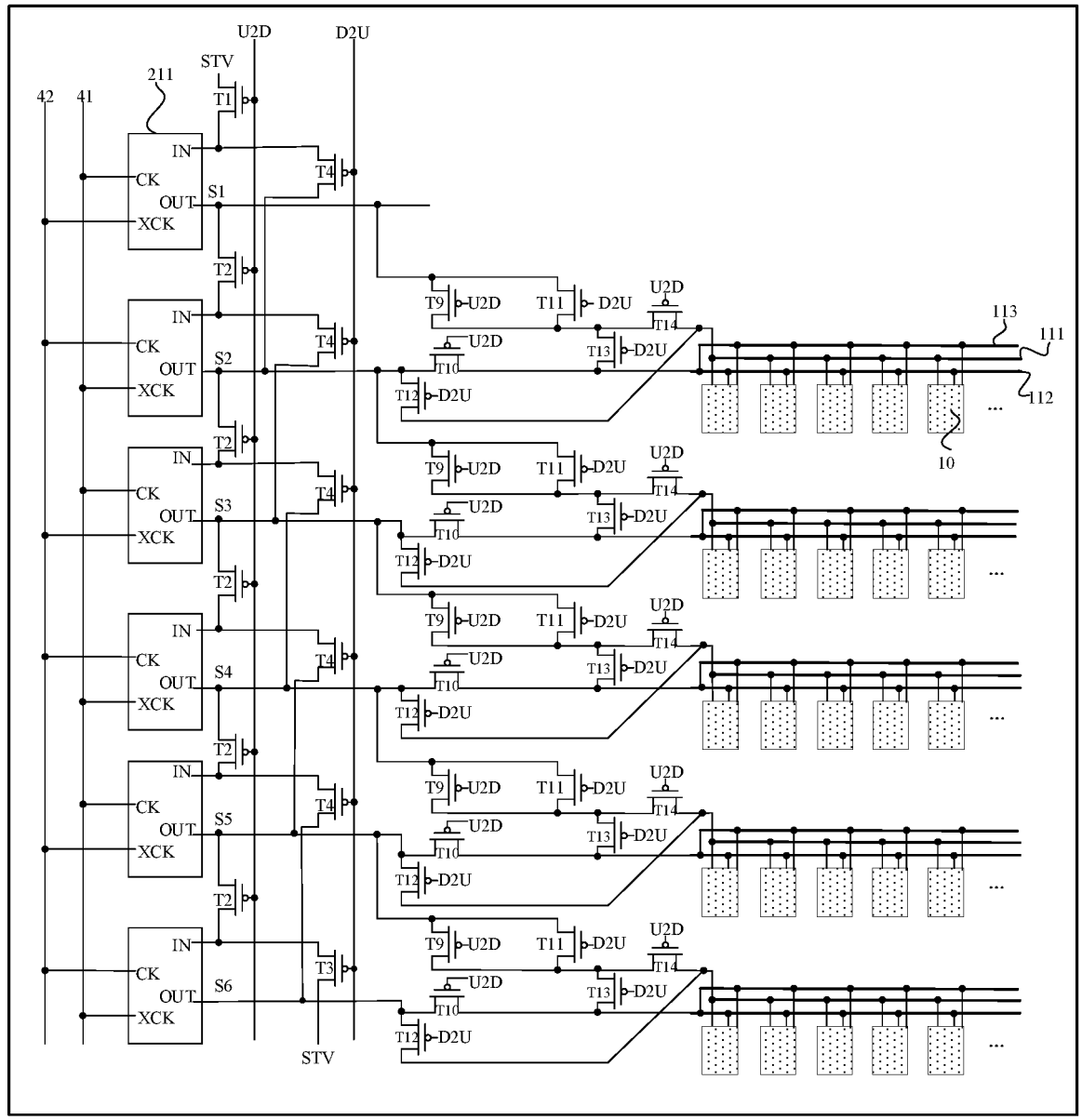

In some optional embodiments, as shown in FIGS. 18 to 19, the gate driving circuit may only include the plurality of first shift register units. The scan signal line 11 may also include a third scan line 113, and signals on the third scan line 113 may be used to control the writing of the second reset signal Vref2 to the anode of the light-emitting element D of the pixel circuits 10. As mentioned above, it may be sufficient to reset the anode of the light-emitting element D before the light-emitting stage t3. Therefore, the signal on the third scan line 113 may be the same as any one of the first scan line 111 and the second scan line 112.

For example, as shown in FIG. 18, the third scan line 113 corresponding to the i-th row of the pixel circuits 10 may be electrically connected to the first scan line 111 corresponding to the i-th row of the pixel circuits 10. In other words, the signal on the third scan line 113 corresponding to the i-th row of the pixel circuits 10 may be the same as the signal on the first scan line 111 corresponding to the i-th row of the pixel circuits 10.

For another example, as shown in FIG. 19, the third scan line 113 corresponding to the i-th row of the pixel circuits 10 may be electrically connected to the second scan line 112 corresponding to the i-th row of the pixel circuits 10. In other words, the signal on the third scan line 113 corresponding to the i-th row of the pixel circuits 10 may be the same as the signal on the second scan line 112 corresponding to the i-th row of the pixel circuits 10. In both the examples shown in FIGS. 18 and 19, the anode of the light-emitting element may be able to be reset before the light-emitting stage, so as to ensure the normal operation of the pixel circuits.

Figure 20:
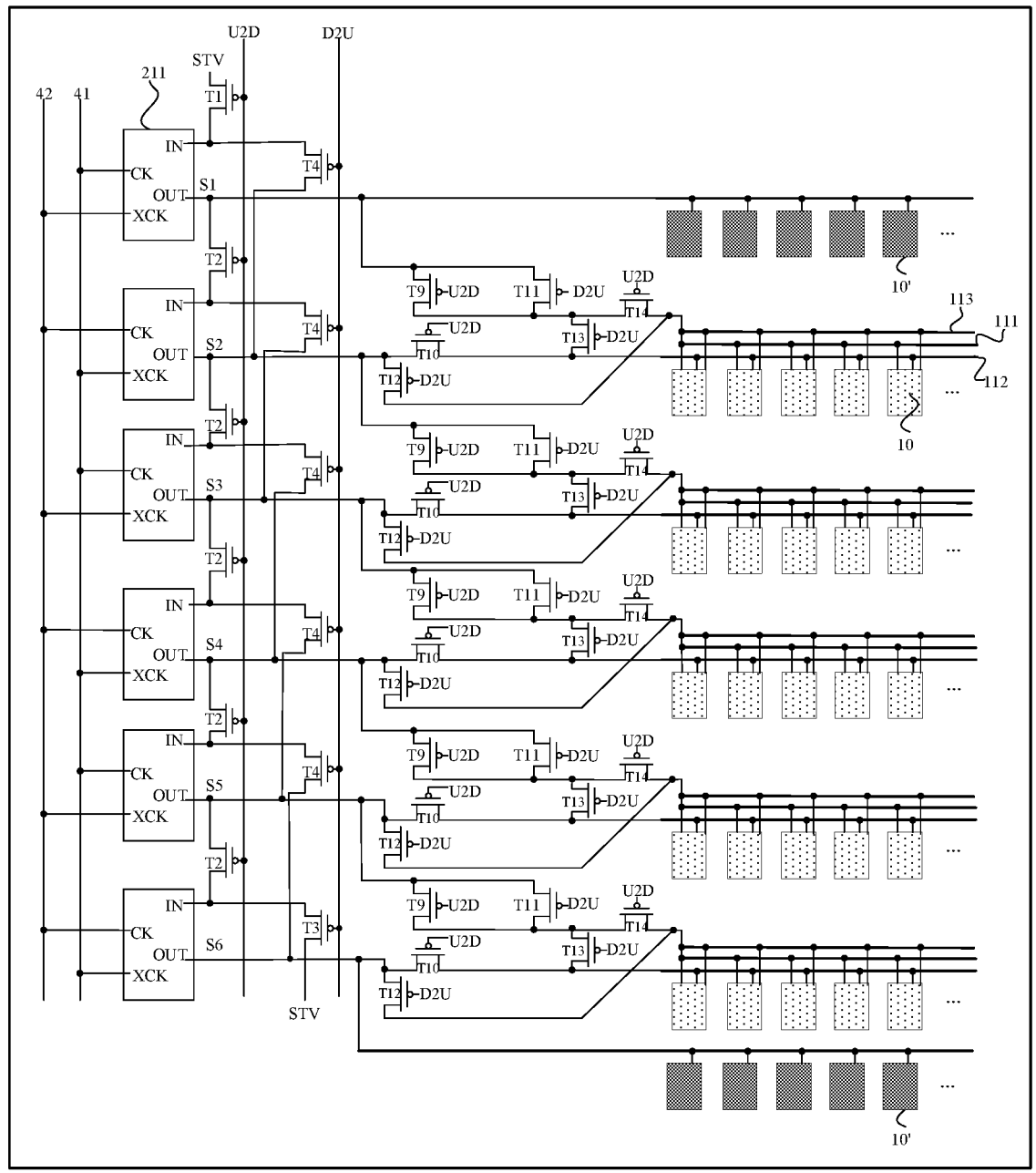

As mentioned above, to ensure that the pixel circuits is able to work normally in both the forward and reverse scanning directions, the number of rows of the pixel circuits may need to be set to be smaller than the number of stages of the plurality of first shift register units. As shown in FIGS. 17 to 19, the signal output terminal of the first stage first shift register unit S1 may be not electrically connected to the pixel circuits 10, the signal output terminal of each of the second stage first shift register unit S2 to the (N−1)-th stage first shift register unit S1 may be electrically connected to corresponding two rows of the pixel circuits 10, and the signal output ends of the last stage first shift register unit S1 may be only electrically connected to one corresponding row of the pixel circuits 10, resulting in the load of the plurality of first shift register units 211 are different and uneven display. To balance the load of each first shift register unit 211 and improve display uniformity, as shown in FIG. 20, the display panel 100 may further include a plurality of dummy pixel circuits 10'. It can be understood that the plurality of dummy pixel circuits 10' do not emit light. The plurality of dummy pixel circuits 10' may be located in the non-display area of the display panel 100. At least one of the signal output terminal of the first stage first shift register unit S1 and the signal output terminal of the last stage first shift register unit S1 may be electrically connected to the plurality of dummy pixel circuits 10'.

For example, as shown in FIG. 16, the plurality of dummy pixel circuits 10' may be provided in two rows. The signal output terminal of the first stage first shift register unit S1 may be electrically connected to one row of the plurality of dummy pixel circuits 10', and the signal output terminal of the last stage first shift register S6 may be electrically connected to another row of the plurality of dummy pixel circuits 10'. In addition, since the plurality of dummy pixel circuits 10' do not emit light, the signal output terminal of the first stage first shift register unit S1 and the signal output terminal of the last stage first shift register unit S6 may be directly connected to the plurality of dummy pixel circuits 10'. It may be not necessary to provide a switch element between the signal output terminal of the first stage first shift register unit S1 and the plurality of dummy pixel circuits 10', and between the signal output terminal of the last stage first shift register unit S6 and the plurality of dummy pixel circuits 10'.

In one embodiment, the display panel 100 may be an organic light-emitting diode (OLED) display panel.

Figure 21:
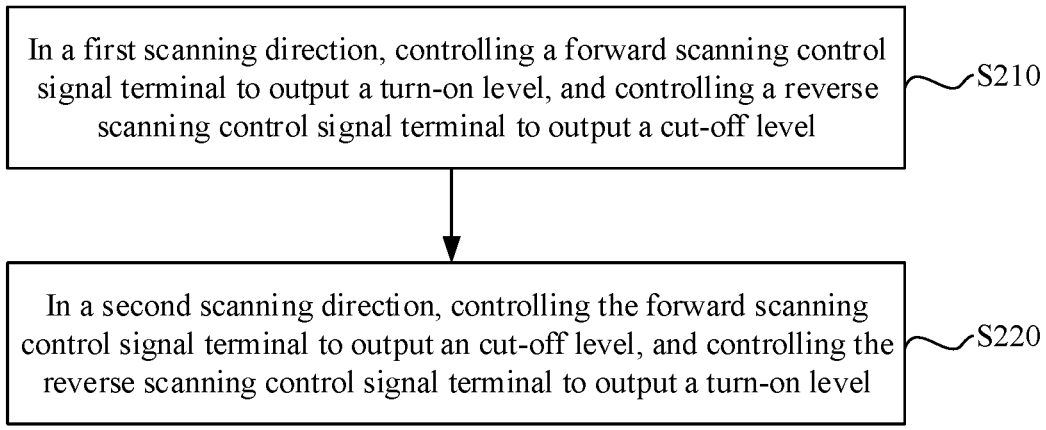
FIG. 21 illustrates an exemplary driving method of a display panel consistent with various disclosed embodiments in the present disclosure.

The present disclosure also provides a driving method of a display panel, to drive any display panel provided by various embodiments of the present disclosure. As shown in FIG. 21, in one embodiment, the driving method of the display panel may include S210 and S220.

In S210, in a first scanning direction, a forward scanning control signal terminal may be controlled to output a turn-on electrical level, and a reverse scanning control signal terminal may be controlled to output a cut-off electrical level.

In S220, in a second scanning direction, the forward scanning control signal terminal may be controlled to output an cut-off electrical level, and the reverse scanning control signal terminal may be controlled to output an turn-on electrical level.

The first scanning direction may be understood as a forward scanning direction, and the second scanning direction may be be understood as a reverse scanning direction.

In the present disclosure, the display panel may be provided with the first switch element to the fourth switch element. It may be only necessary to control the on and off conditions of the first switch element to the fourth switch element in different scanning directions, and there may be no need to change signals provided by the trigger signal terminal STV. It may be achieved that the first stage first shift register unit to the N-th stage first shift register unit output the scanning signal in turn in the forward scanning direction, and the N-th stage first shift register unit to the first stage first shift register unit sequentially output scanning signals without re-downloading the code corresponding to the trigger signal terminal. The technical problem that the display panel cannot realize the instant switching of the forward and reverse scanning functions may be resolved.

Exemplarily, the driving method of the display panel provided in the embodiments of the present disclosure may be executed by a driving chip of the display panel.

Figure 22:
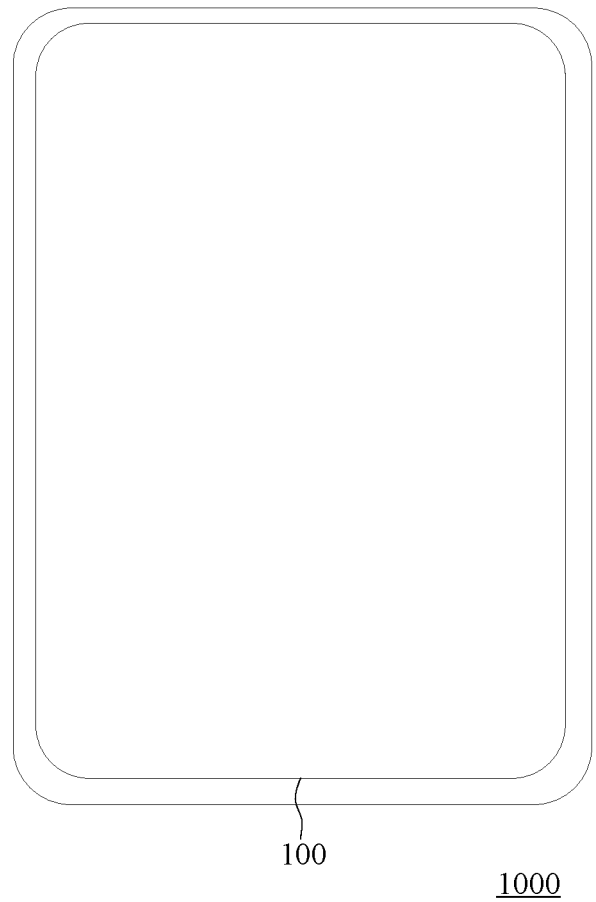
FIG. 22 illustrates an exemplary display device consistent with various disclosed embodiments in the present disclosure.

The present disclosure also provides a display device. The display device may include any display panel provided by various embodiments of the present disclosure. As shown in FIG. 22 which is a schematic structural diagram of a display device provided by an embodiment of the present disclosure, the display device 1000 may include a display panel 100 provided by various embodiments of the present disclosure. The embodiment of FIG. 22 where the display device is a mobile phone is used as an example to illustrate the present disclosure, and does not limit the scope of the present disclosure. It is understandable that the display device in various embodiments may be a wearable product, a computer, a television, a vehicle display device, etc., with other display functions. The display device provided by the the present disclosure may have the beneficial effects of the display panel provided by the present disclosure. For details, please refer to the specific description of the display panel in the foregoing embodiments, which will not be repeated in this embodiment.

In the present disclosure, the display panel may be provided with the first switch element to the fourth switch element. It may be only necessary to control the on and off conditions of the first switch element to the fourth switch element in different scanning directions, and there may be no need to change signals provided by the trigger signal terminal STV. It may be achieved that the first stage first shift register unit to the N-th stage first shift register unit output the scanning signal in turn in the forward scanning direction, and the N-th stage first shift register unit to the first stage first shift register unit sequentially output scanning signals without re-downloading the code corresponding to the trigger signal terminal. The technical problem that the display panel cannot realize the instant switching of the forward and reverse scanning functions may be resolved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel with a display region and a non-display region, comprising:
M rows of pixel circuits in the display region; and
a gate driving circuit in the non-display region,
wherein:
the gate driving circuit includes a first gate driving circuit;
the first gate drive circuit includes N stages of cascaded first shift register units;
a trigger signal input terminal of a first stage first shift register unit is electrically connected to a trigger signal terminal through a first switch element;
a signal output terminal of an i-th stage first shift register unit is electrically connected to a trigger signal input terminal of an (i+1)-th stage first shift register unit through a second switch element;
control terminals of the first switch element and the second switch element are electrically connected to a forward scanning control signal terminal;
a trigger signal input terminal of an N-th stage first shift register unit is electrically connected to the trigger signal terminal through a third switch element;

a signal output terminal of a j-th stage first shift register unit is electrically connected to a trigger signal input terminal of a (j−1)-th stage first shift register unit through a fourth switch element;
control terminals of the third switch element and the fourth switch element are electrically connected to a reverse scan control signal terminal;
M, N, i, j are all positive integers, and N is greater than M, $1 \le i \le N-1$, and $2 \le j \le N$;
the display panel further includes at least a first clock signal line and a second clock signal line;
the first shift register units are all electrically directly connected to the first clock signal line and the second clock signal line without being through a switch element;
the first clock signal line is electrically connected to a first clock signal terminal through a fifth switch element, and is electrically connected to a second clock signal terminal through a sixth switch element;
the second clock signal line is electrically connected to the second clock signal terminal through a seventh switch element, and is electrically connected to the first clock signal terminal through an eighth switch element, wherein each of the fifth switch element, the sixth switch element, the seventh switch element, and the eighth switch element is different from one another; and
when the first clock signal terminal outputs a turn-on electrical level, the second clock signal terminal outputs a cut-off electrical level, and when the second clock signal terminal outputs a turn-on electrical level, the first clock signal terminal outputs a cut-off electrical level.

2. The display panel according to claim 1, wherein:
the gate driving circuit further includes a second gate driving circuit;
the second gate driving circuit includes N stages of cascaded second shift register units;
the second shift register units and the first shift register units have same circuit structures;
a signal output terminal of a k-th stage first shift register unit is electrically connected to a trigger signal input terminal of a k-th stage second shift register unit; $1 \le k \le N$, and k is a positive integer;
the second shift register units are all electrically connected to the first clock signal line and the second clock signal line;
control terminals of the fifth switch element and the seventh switch element are electrically connected to the forward scanning control signal terminal; and
control terminals of the sixth switch element and the eighth switch element are both electrically connected to the reverse scanning control signal terminal.

3. The display panel according to claim 2, wherein:
each of the first shift register units and each of the second shift register units include a first clock signal input terminal and a second clock signal input terminal;
the first clock signal input terminals of the first shift register units of odd-numbered stages and the first clock signal input terminals of the second shift register unit of even-numbered stages are electrically connected to the first clock signal line;
the second clock signal input terminals of the first shift register units of odd-numbered stages and the second clock signal input terminals of the second shift register units of even-numbered stages are electrically connected to the second clock signal line;
the first clock signal input terminals of the first shift register units of the even-numbered stages and the first clock signal input terminals of the second shift register unit of the odd-numbered stages are electrically connected to the second clock signal line; and
the second clock signal input terminals of the first shift register units of the even-numbered stages and the second clock signal input terminals of the second shift register units of the odd-numbered stages are electrically connected to the first clock signal line.

4. The display panel according to claim 3, wherein: $N-M \ge 2$.

5. The display panel according to claim 3, wherein:
each row of the pixel circuits is electrically connected to at least a first scan line and a second scan line;
signals on the first scan line are used to control a first reset signal to be written into a gate of a driving transistor of a corresponding pixel circuit;
signals on the second scan line are used to control a data signal to be written into a corresponding pixel circuit;
a signal output terminal of the a-th stage first shift register unit is electrically connected to a first scan line corresponding to the (a−1)-th row of the pixel circuits;
a signal output terminal of the a-th stage second shift register unit is electrically connected to a second scan line corresponding to the (a−1)-th row of the pixel circuits; and
$N-M=2$, $2 \le a \le N-1$, and a is a positive integer.

6. The display panel according to claim 5, wherein:
each row of the pixel circuits is electrically connected to at least a third scan line;
signals on the third scan line are used to control a second reset signal to be written into an anode of a light-emitting element of a corresponding pixel circuit; and
a signal output terminal of the a-th stage first shift register unit is electrically connected to a third scan line corresponding to the (a−1)-th row of the pixel circuits, or a signal output terminal of the a-th stage second shift register unit is electrically connected to a third scan line corresponding to the (a−1)-th row of the pixel circuits, or a signal output terminal of the (a+1)-th stage first shift register unit is electrically connected to a third scan line corresponding to the (a−1)-th row of the pixel circuits.

7. The display panel according to claim 5, further including dummy pixel circuits, wherein:
at least one of a signal output terminal of the first stage first shift register unit, a signal output terminal of the first stage second shift register unit, and a signal output terminal of a last stage second shift register unit, is electrically connected to the dummy pixel circuits.

8. The display panel according to claim 2, wherein:
all of the first switch element to the eighth switch element are thin film transistors.

9. The display panel according to claim 1, wherein:
each row of the pixel circuits is electrically connected to at least a first scan line and a second scan line;
signals on the first scan line are used to control a first reset signal to be written into a gate of a driving transistor of a corresponding pixel circuit;
signals on the second scan line are used to control a data signal to be written into a corresponding pixel circuit;
a signal output terminal of an i-th stage first shift register unit is electrically connected to a first scan line corresponding to an i-th row of the pixel circuits through a ninth switch element and a fourteenth switch element in series;

a signal output terminal of an (i+1)-th stage first shift register unit is electrically connected to a second scan line corresponding to the i-th row of the pixel circuits through a tenth switch element;

a signal output terminal of the i-th stage first shift register unit is electrically connected to a second scan line corresponding to the i-th row of the pixel circuits through an eleventh switch element and a thirteenth switch element in series;

a signal output terminal of the (i+1)-th stage first shift register unit is electrically connected to a first scan line corresponding to the i-th row of the pixel circuits through a twelfth switch element;

control terminals of the ninth switch element, the tenth switch element, and the fourteenth switch element are all electrically connected to the forward scan control signal terminal;

control terminals of the eleventh switch element, the twelfth switch element, and the thirteenth switch element, are electrically connected to the reverse scan control signal terminal; and $N-M \geq 1$.

10. The display panel according to claim 9, wherein:

each row of the pixel circuits is electrically connected to at least a third scan line;

signals on the third scan line are used to control a second reset signal to be written into an anode of a light-emitting element of a corresponding pixel circuit; and the third scan line corresponding to the i-th row of the pixel circuits is electrically connected to the first scan line corresponding to the i-th row of the pixel circuits, or the third scan line corresponding to the i-th row of the pixel circuits is electrically connected to the second scan line corresponding to the i-th row of the pixel circuits.

11. The display panel according to claim 9, wherein: $N-M=1$.

12. The display panel according to claim 9, further including dummy pixel circuits, wherein:

at least one of a signal output terminal of the first stage first shift register unit or a signal output terminal of the last stage first shift register unit, is electrically connected to the dummy pixel circuits.

13. The display panel according to claim 9, wherein:

all of the first switch element to the eighth switch element, and the ninth switch element to the fourteenth switch element are thin film transistors.

14. A driving method for driving a display panel, the display panel including M rows of pixel circuits in the display region; and a gate driving circuit in the non-display region, wherein:

the gate driving circuit includes a first gate driving circuit;

the first gate drive circuit includes N stages of cascaded first shift register units;

a trigger signal input terminal of the first stage first shift register unit is electrically connected to a trigger signal terminal through a first switch element;

a signal output terminal of the i-th stage first shift register unit is electrically connected to a trigger signal input terminal of the (i+1)-th stage first shift register unit through a second switch element;

control terminals of the first switch element and the second switch element are electrically connected to a forward scanning control signal terminal;

a trigger signal input terminal of the N-th stage first shift register unit is electrically connected to the trigger signal terminal through a third switch element;

a signal output terminal of the j-th stage first shift register unit is electrically connected to a trigger signal input terminal of the (j−1)-th stage first shift register unit through a fourth switch element;

control terminals of the third switch element and the fourth switch element are electrically connected to a reverse scan control signal terminal;

M, N, i, j are all positive integers, and N is greater than M, $1 \leq i \leq N-1$, and $2 \leq j \leq N$, the driving method comprising:

in a first scanning direction, controlling a forward scanning control signal terminal to output a turn-on electrical level, and controlling a reverse scanning control signal terminal to output a cut-off electrical level;

in a second scanning direction, controlling the forward scanning control signal terminal to output a cut-off electrical level, and controlling the reverse scanning control signal terminal to output a turn-on electrical level;

the display panel further includes at least a first clock signal line and a second clock signal line;

the first shift register units are all directly electrically connected to the first clock signal line and the second clock signal line without being through a switch element;

the first clock signal line is electrically connected to a first clock signal terminal through a fifth switch element, and is electrically connected to a second clock signal terminal through a sixth switch element;

the second clock signal line is electrically connected to the second clock signal terminal through a seventh switch element, and is electrically connected to the first clock signal terminal through an eighth switch element, wherein each of the fifth switch element, the sixth switch element, the seventh switch element, and the eighth switch element is different from one another; and when the first clock signal terminal outputs a turn-on electrical level, the second clock signal terminal outputs a cut-off electrical level, and when the second clock signal terminal outputs a turn-on electrical level, the first clock signal terminal outputs a cut-off electrical level.

15. A display device, comprising a display panel, wherein:

the display panel includes:

M rows of pixel circuits in the display region;

a gate driving circuit in the non-display region, wherein:

the gate driving circuit includes a first gate driving circuit;

the first gate drive circuit includes N stages of cascaded first shift register units;

a trigger signal input terminal of the first stage first shift register unit is electrically connected to a trigger signal terminal through a first switch element;

a signal output terminal of the i-th stage first shift register unit is electrically connected to a trigger signal input terminal of the (i+1)-th stage first shift register unit through a second switch element;

control terminals of the first switch element and the second switch element are electrically connected to a forward scanning control signal terminal;

a trigger signal input terminal of the N-th stage first shift register unit is electrically connected to the trigger signal terminal through a third switch element;

a signal output terminal of the j-th stage first shift register unit is electrically connected to a trigger signal input terminal of the (j−1)-th stage first shift register unit through a fourth switch element;

control terminals of the third switch element and the fourth switch element are electrically connected to a reverse scan control signal terminal;

M, N, i, j are all positive integers, N is greater than M, $1 \leq i \leq N-1$, and $2 \leq j \leq N$;

the display panel further includes at least a first clock signal line and a second clock signal line;

the first shift register units are all directly electrically connected to the first clock signal line and the second clock signal line without being through a switch element;

the first clock signal line is electrically connected to a first clock signal terminal through a fifth switch element, and is electrically connected to a second clock signal terminal through a sixth switch element;

the second clock signal line is electrically connected to the second clock signal terminal through a seventh switch element, and is electrically connected to the first clock signal terminal through an eighth switch element, wherein each of the fifth switch element, the sixth switch element, the seventh switch element, and the eighth switch element is different from one another; and when the first clock signal terminal outputs a turn-on electrical level, the second clock signal terminal outputs a cut-off electrical level, and when the second clock signal terminal outputs a turn-on electrical level, the first clock signal terminal outputs a cut-off electrical level.

* * * * *